United States Patent
Hizu

(10) Patent No.: US 11,553,151 B2
(45) Date of Patent: Jan. 10, 2023

(54) SOLID-STATE IMAGING DEVICE, METHOD OF CONTROLLING SOLID-STATE IMAGING DEVICE, AND ELECTRONIC DEVICE

(71) Applicant: SONY SEMICONDUCTOR SOLUTIONS CORPORATION, Kanagawa (JP)

(72) Inventor: Kazuki Hizu, Kanagawa (JP)

(73) Assignee: SONY SEMICONDUCTOR SOLUTIONS CORPORATION, Kanagawa (JP)

( * ) Notice: Subject to any disclaimer, the term of this patent is extended or adjusted under 35 U.S.C. 154(b) by 29 days.

(21) Appl. No.: 17/277,286

(22) PCT Filed: Aug. 28, 2019

(86) PCT No.: PCT/JP2019/033616
§ 371 (c)(1),
(2) Date: Mar. 17, 2021

(87) PCT Pub. No.: WO2020/066433
PCT Pub. Date: Apr. 2, 2020

(65) Prior Publication Data
US 2022/0030190 A1    Jan. 27, 2022

(30) Foreign Application Priority Data
Sep. 28, 2018    (JP) .............................. JP2018-186127

(51) Int. Cl.
*H04N 5/3745*    (2011.01)
*H01L 27/146*    (2006.01)
*H04N 5/361*    (2011.01)

(52) U.S. Cl.
CPC ... *H04N 5/37455* (2013.01); *H01L 27/14612* (2013.01); *H01L 27/14623* (2013.01); *H04N 5/361* (2013.01); *H04N 5/37452* (2013.01)

(58) Field of Classification Search
CPC .............. H04N 5/37455; H04N 5/361; H04N 5/37452; H04N 5/341; H04N 5/3745;
(Continued)

(56) References Cited

U.S. PATENT DOCUMENTS

| | | | |
|---|---|---|---|
| 10,401,218 B2 * | 9/2019 | Fujiwara | ............... H01L 31/107 |
| 2006/0181627 A1 | 8/2006 | Farrier | |

(Continued)

FOREIGN PATENT DOCUMENTS

| | | |
|---|---|---|
| CN | 105324986 A | 2/2016 |
| CN | 107079115 A | 8/2017 |

(Continued)

OTHER PUBLICATIONS

Extended European Search Report of EP Application No. 19864558.2, dated Oct. 27, 2021, 07 pages.

(Continued)

*Primary Examiner* — Gevell V Selby
(74) *Attorney, Agent, or Firm* — Chip Law Group

(57) ABSTRACT

A solid-state imaging device according to an embodiment includes a plurality of pixels (20*a*) arrayed in a two-dimensional lattice, and a control unit (115). The pixel includes a first light receiving element (401*a*) that outputs a first photocurrent corresponding to received light, a second light receiving element (401*b*) that outputs a second photocurrent corresponding to received light, a conversion unit (300) that converts a current into a voltage, an output unit (320 or 330) that detects an event based on a change in the voltage converted by the conversion unit, and outputs a detection signal indicating a detection result of the detection, and a switch unit (113*a*) that performs switching of switching the current to be converted into the voltage by the conversion (Continued)

unit between the first photocurrent and the second photocurrent. The control unit controls the switching performed by the switch unit.

13 Claims, 26 Drawing Sheets

(58) Field of Classification Search
CPC .............. H04N 5/378; H01L 27/14612; H01L 27/14623; H01L 27/14605; H01L 27/14641; H01L 27/146; H01L 31/10
See application file for complete search history.

(56) References Cited

U.S. PATENT DOCUMENTS

| | | | |
|---|---|---|---|
| 2015/0069218 | A1 | 3/2015 | Cho et al. |
| 2016/0094796 | A1 | 3/2016 | Govil |
| 2016/0156862 | A1 | 6/2016 | Yoshimura et al. |
| 2018/0167570 | A1 | 6/2018 | Suh et al. |
| 2018/0308883 | A1 | 10/2018 | Yanagita et al. |
| 2020/0084403 | A1* | 3/2020 | Suh .................... H04N 5/379 |
| 2020/0137333 | A1* | 4/2020 | Suh .................... H04N 5/361 |
| 2020/0335537 | A1 | 10/2020 | Yanagita et al. |

FOREIGN PATENT DOCUMENTS

| | | |
|---|---|---|
| CN | 108140661 A | 6/2018 |
| EP | 3369113 A1 | 9/2018 |
| JP | 2017-535999 A | 11/2017 |
| JP | 6480862 B2 | 3/2019 |
| JP | 6754157 B2 | 9/2020 |
| KR | 10-2015-0029285 A | 3/2015 |
| KR | 10-2016-0034848 A | 3/2016 |
| KR | 10-2018-0068720 A | 6/2018 |
| KR | 10-2018-0075497 A | 7/2018 |
| WO | 2015/012098 A1 | 1/2015 |
| WO | 2017/073322 A1 | 5/2017 |

OTHER PUBLICATIONS

Lenero-Bardallo, et al., "A 3.6 fLS Latency Asynchronous Frame-Free Event-Driven Dynamic-Vision-Sensor", IEEE Journal of Solid-State Circuits, vol. 46, No. 6, XP055556546, Jun. 1, 2011, pp. 1443-1455.

International Search Report and Written Opinion of PCT Application No. PCT/JP2019/033616, dated Nov. 19, 2019, 09 pages of ISRWO.

* cited by examiner

SOLID-STATE IMAGING DEVICE, METHOD OF CONTROLLING SOLID-STATE IMAGING DEVICE, AND ELECTRONIC DEVICE

CROSS REFERENCE TO RELATED APPLICATIONS

This application is a U.S. National Phase of International Patent Application No. PCT/JP2019/033616 filed on Aug. 28, 2019, which claims priority benefit of Japanese Patent Application No. JP 2018-186127 filed in the Japan Patent Office on Sep. 28, 2018. Each of the above-referenced applications is hereby incorporated herein by reference in its entirety.

FIELD

The present invention relates to a solid-state imaging device, a method of controlling a solid-state imaging device, and an electronic device.

BACKGROUND

In a solid-state imaging apparatus using a complementary metal oxide semiconductor (CMOS) or the like, an asynchronous solid-state imaging device in which for each pixel address, a detection circuit that detects, as an address event, a signal indicating that the amount of light received by a light receiving element in each pixel exceeds a threshold value in real time is provided for each pixel has been proposed (for example, Patent Literature 1). As stated above, the solid-state imaging device that detects the address event for each pixel is called a dynamic vision sensor (DVS).

CITATION LIST

Patent Literature

Patent Literature 1: Japanese Laid-open Patent Publication No. 2017-535999

SUMMARY

Technical Problem

The asynchronous solid-state imaging device such as this DVS is used, and thus, a faster response can be performed compared to a case where the existing synchronous solid-state imaging device that captures image data synchronized with a synchronization signal such as a vertical synchronizing signal is used. Thus, there is a demand for more various methods of utilizing the asynchronous solid-state imaging device.

An object of the present disclosure is to enable utilization of a solid-state imaging device that detects an address event by more various methods.

Solution to Problem

For solving the problem described above, a solid-state imaging device according to one aspect of the present disclosure has a plurality of pixels arrayed in a two-dimensional lattice; and a control unit, wherein the pixel includes a first light receiving element that outputs a first photocurrent corresponding to received light, a second light receiving element that outputs a second photocurrent corresponding to received light, a conversion unit that converts a current into a voltage, an output unit that detects an event based on a change in the voltage converted by the conversion unit, and outputs a detection signal indicating a detection result of the detection, and a switch unit that performs switching of switching the current to be converted into the voltage by the conversion unit between the first photocurrent and the second photocurrent, and the control unit controls the switching performed by the switch unit.

DESCRIPTION OF EMBODIMENTS

Hereinafter, embodiments of the present disclosure will be described in detail with reference to the drawings. In the following embodiments, the same portions will be denoted by the same reference signs, and redundant description will be omitted.

Embodiments

Configuration Example of Electronic Device Applicable to Each Embodiment

Figure 1:
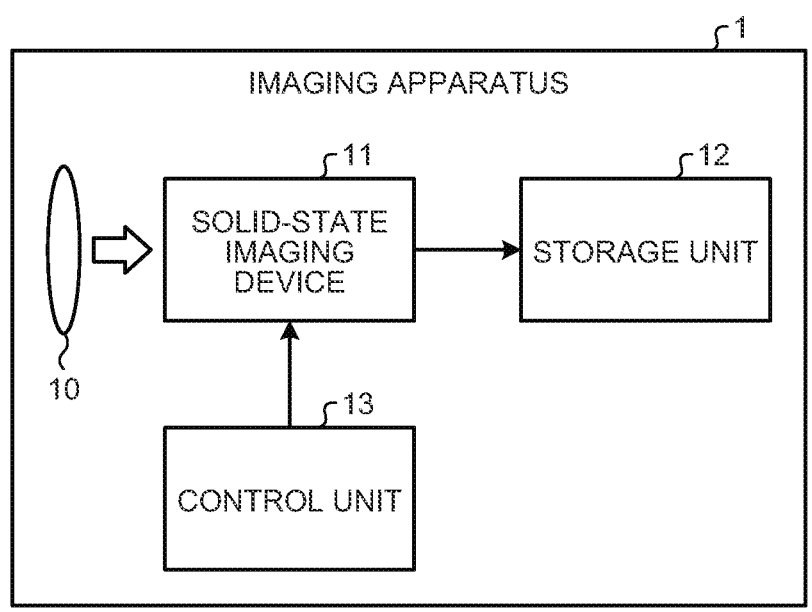
FIG. 1 is a schematic diagram illustrating a configuration of an example of an imaging apparatus as an electronic device to which a solid-state imaging device according to an embodiment is applied.

FIG. 1 is a schematic diagram illustrating a configuration of an example of an imaging apparatus as an electronic device to which a solid-state imaging device according to each embodiment is applied. In FIG. 1, an imaging apparatus 1 includes an optical system 10, a solid-state imaging device 11, a storage unit 12, and a control unit 13. The optical system 10 includes one or more lenses and various mechanisms such as an autofocus mechanism and a diaphragm mechanism, and guides light from a subject to a light receiving surface of the solid-state imaging device 11.

The solid-state imaging device 11 includes pixels each including a plurality of light receiving elements that converts incident light rays into electric signals by photoelectric conversion and outputs the electric signals, and a drive circuit that drives the pixels. The solid-state imaging device 11 further includes a signal processing unit that performs predetermined signal processing on the signal output from the pixel and outputs the signal as output data.

The storage unit 12 stores the output data output from the solid-state imaging device 11 in a storage medium. A non-volatile storage medium such as a flash memory or a hard disk drive can be applied as the storage unit 12. The present invention is not limited thereto, and a volatile storage medium such as a dynamic random access memory (DRAM) can be applied as the storage medium.

The control unit 13 controls the solid-state imaging device 11 to cause the solid-state imaging device 11 to execute an imaging operation of outputting the above-mentioned output data.

First Embodiment

Figure 2:
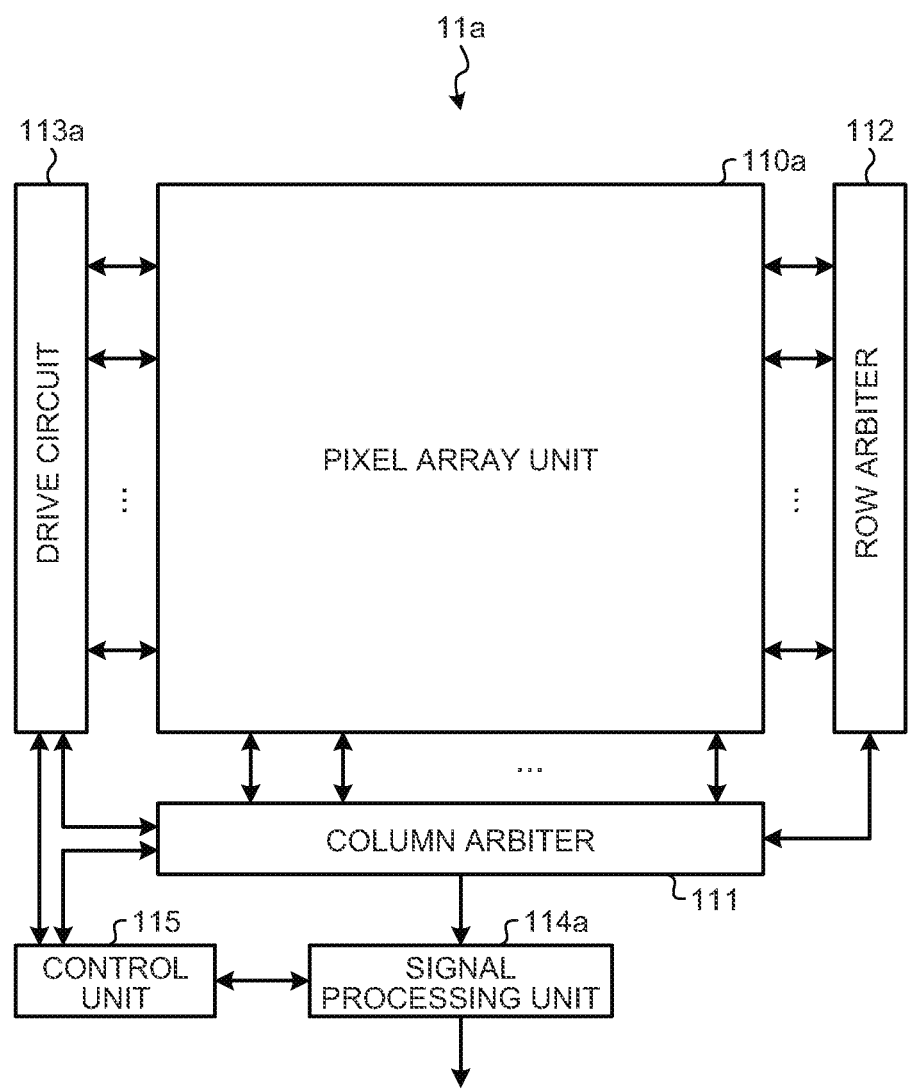
FIG. 2 is a block diagram illustrating a configuration of an example of a solid-state imaging device applicable to a first embodiment.

A first embodiment will be described. FIG. 2 is a block diagram illustrating a configuration of an example of a solid-state imaging device 11a applicable to the first embodiment which corresponds to the above-mentioned solid-state imaging device 11. As illustrated in FIG. 2, the solid-state imaging device 11a includes a pixel array unit 110a, a column arbiter 111, a row arbiter 112, a drive circuit 113a, a signal processing unit 114a, and a control unit 115.

In the pixel array unit 110a, a plurality of pixels is arrayed in a two-dimensional lattice. Hereinafter, an array in a horizontal direction in FIG. 2 is referred to as a "row", and an array in a direction perpendicular to the row is referred to as a "column".

Each pixel included in the pixel array unit 110a includes a plurality of light receiving elements that outputs photocurrents corresponding to the received light rays, and an address event detection unit that detects an address event based on the amount of changes in the photocurrents output from the plurality of light receiving elements. Each pixel outputs a request to the column arbiter 111 and the row arbiter 112 according to the occurrence of the address event.

The column arbiter 111 and the row arbiter 112 perform arbitration in cooperation with each other according to the request output from each pixel included in the pixel array unit 110a, and select an event detection signal output from a specific pixel. In the example of FIG. 2, the selected event detection signal is output from the column arbiter 111. The column arbiter 111 and the row arbiter 112 output address information for specifying the pixel that outputs the selected event detection signal together with the event detection signal.

The drive circuit 113a drives each of the pixels to cause each pixel to execute the address event detection. In the example of FIG. 2, the drive circuit 113a drives the pixels included in the pixel array unit 110a in units of rows. However, in reality, the pixels included in the pixel array unit 110a are driven in a column direction and a row direction, and thus, an address event detection operation can be executed for each pixel.

The event detection signal and the address information output from the column arbiter 111 are supplied to the signal processing unit 114a. The signal processing unit 114a executes signal processing such as image recognition processing based on the event detection signal and the address information. The signal processing unit 114a outputs, as output data, event detection data indicating the processing result, and supplies the output data to the storage unit 120.

The solid-state imaging device 11a described with reference to FIG. 2 can be formed as, for example, a stacked contact image sensor (CIS) formed by stacking a plurality of semiconductor chips. As an example, the solid-state imaging device 11a can be formed by a two-layer structure in which semiconductor chips are stacked in two layers.

Figure 3:
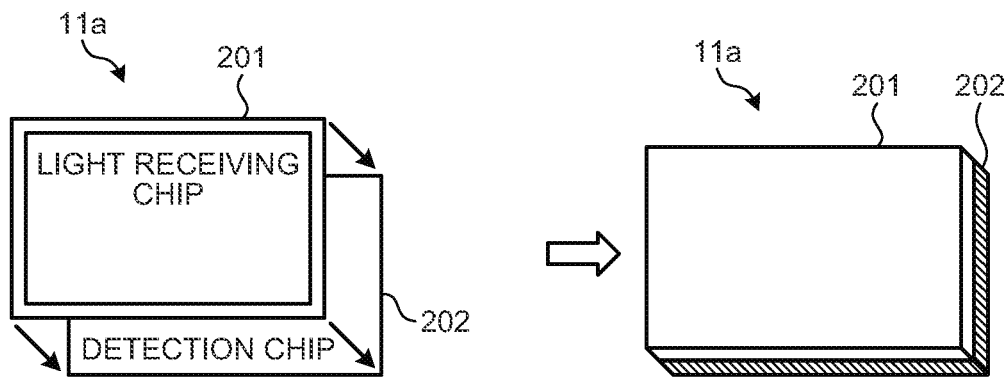
FIG. 3 is a diagram illustrating an example in which the solid-state imaging device according to the first embodiment is formed by a stacked CIS having a two-layer structure.

FIG. 3 is a diagram illustrating an example in which the solid-state imaging device 11a according to the first embodiment is formed by the stacked CIS having the two-layer structure. In the structure of FIG. 3, a light receiving chip 201 including, for example, the light receiving element is formed on the first-layer semiconductor chip, and a detection chip 202 including the address event detection unit that detects the address event based on the photocurrent output from the light receiving element is formed on the second-layer semiconductor chip. As illustrated on a right side of FIG. 3, the solid-state imaging device 11a is formed as one sensor by bonding the first-layer semiconductor chip and the second-layer semiconductor chip while electrically bringing into contact with each other.

Figure 4:
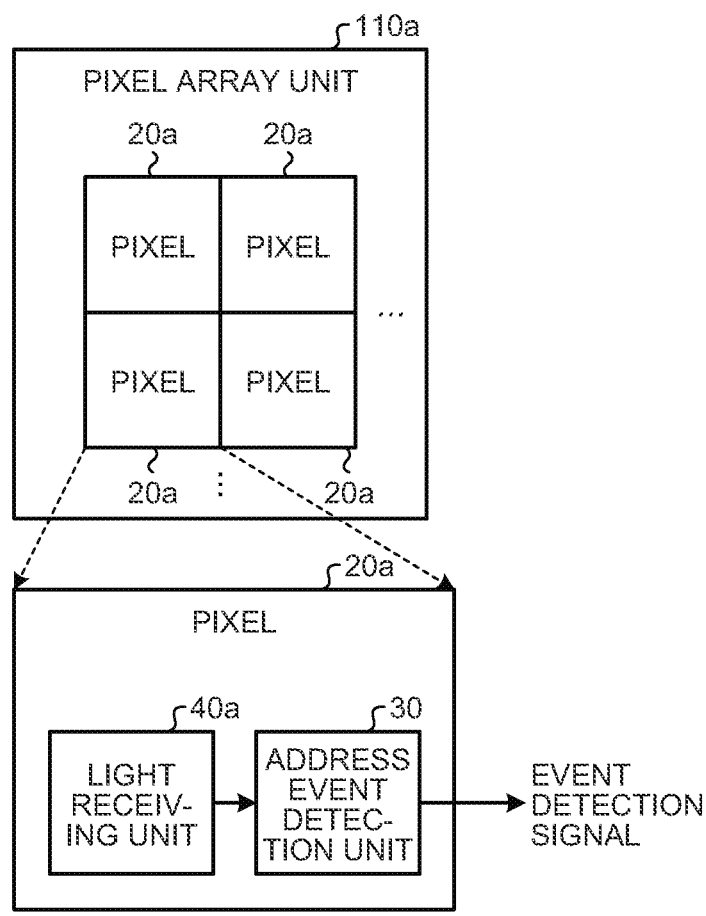
FIG. 4 is a block diagram illustrating an example of a configuration of a pixel array unit applicable to the first embodiment.

FIG. 4 is a block diagram illustrating a configuration of an example of the pixel array unit 110a applicable to the first embodiment. As illustrated on an upper side of FIG. 4, the pixel array unit 110a includes a plurality of pixels 20a arrayed in a two-dimensional lattice. As illustrated in a lower side of FIG. 4, each pixel 20a includes an address event detection unit 30 and a light receiving unit 40a.

The light receiving unit 40a includes a plurality of light receiving elements. Each of the plurality of light receiving elements photoelectrically converts the incident light, and generates the photocurrent. The light receiving unit 40a supplies the photocurrent generated by the light receiving element selected from among the plurality of light receiving elements to the address event detection unit 30 under the control of the drive circuit 113a.

The address event detection unit 30 determines whether or not the amount of change in the photocurrent supplied from the light receiving unit 40a exceeds a threshold value, and detects the presence or absence of the address event based on the determination result. The address event includes, for example, an up event indicating that the amount of change in the photocurrent exceeds an ON threshold value, and a down event indicating that the amount of change is less than an OFF threshold value. The event detection signal indicating the detection of the address event includes, for example, 1 bit indicating the detection result of the up event and 1 bit indicating the detection result of the down event. The address event detection unit 30 can also detect only the up event.

When the occurrence of the address event is detected, the address event detection unit 30 requests the column arbiter 111 and the row arbiter 112 to transmit the event detection signal indicating the occurrence of the address event. When a response to this request is received from the column arbiter 111 and the row arbiter 112, the address event detection unit 30 supplies an address detection signal to the signal processing unit 114a via the column arbiter 111.

Figure 5:
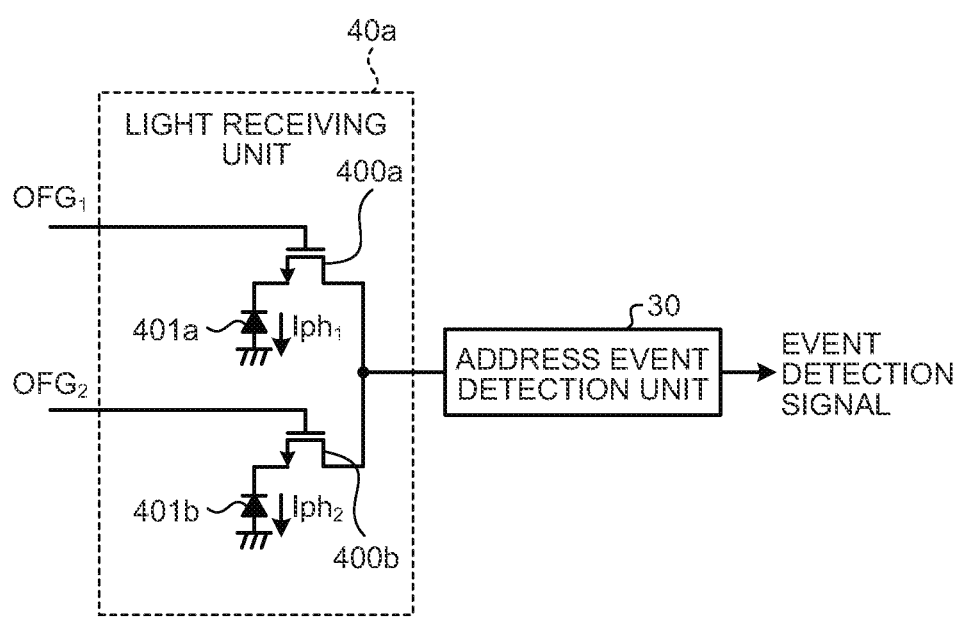
FIG. 5 is a diagram illustrating a configuration of an example of a light receiving unit according to the first embodiment.

FIG. 5 is a diagram illustrating a configuration of an example of the light receiving unit 40a according to the first embodiment. In FIG. 5, the light receiving unit 40a includes two light receiving elements 401a and 401b which are, for example, photodiodes (PD).

In the light receiving element 401a, a cathode is connected to the ground, and an anode is connected to a source of a transistor 400a which is an N-type MOS transistor. A drain of the transistor 400a is connected to the address event detection unit 30. A signal $OFG_1$ is supplied to a gate of the transistor 400a. The transistor 400a is turned on when the signal $OFG_1$ is in a high state, and is turned off when the signal $OFG_1$ is in a low state. When the transistor 400a is in an ON state, a photocurrent $Iph_1$ output from the light receiving element 401a is supplied to the address event detection unit 30.

Similarly, in the light receiving element 401b, a cathode is connected to the ground, and an anode is connected to a source of a transistor 400b which is an N-type MOS transistor. A drain of the transistor 400b is connected to the address event detection unit 30 in common with the drain of the above-mentioned transistor 400a. A signal $OFG_2$ is supplied to a gate of the transistor 400b. The transistor 400b is turned on when the signal $OFG_2$ is in a high state, and is turned off when the signal $OFG_2$ is in a low state. When the transistor 400b is in the ON state, a photocurrent $Iph_2$ output from the light receiving element 401b is supplied to the address event detection unit 30.

Here, in the first embodiment, the light receiving element 401a has sensitivity lower than the light receiving element 401b. That is, when light rays having the same amount of light are incident on the light receiving element 401a and the light receiving element 401b, a current value of the photocurrent $Iph_1$ output from the light receiving element 401a is smaller than a current value of the photocurrent $Iph_2$ output from the light receiving element 401b ($Iph_1 < Iph_2$).

Figure 6A:
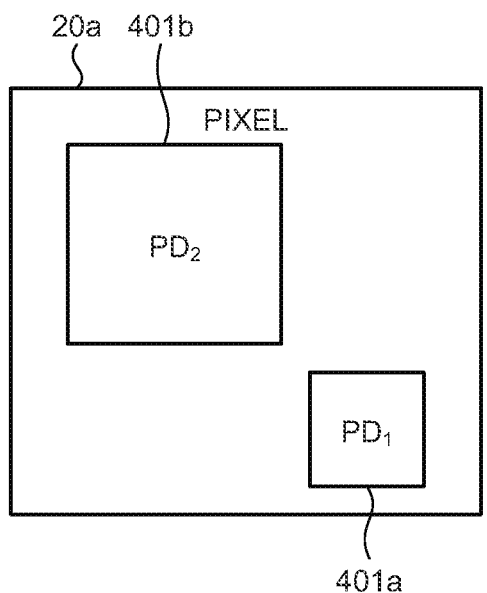
FIG. 6A is a diagram illustrating an example of a pixel including a plurality of light receiving elements having different sensitivities.
Figure 6B:
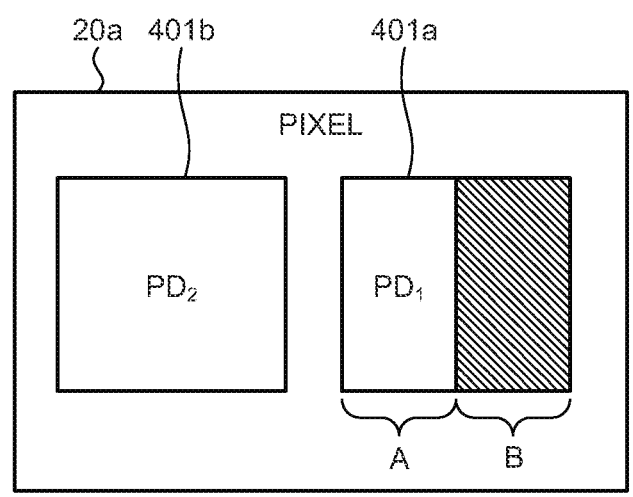
FIG. 6B is a diagram illustrating an example of the pixel including the plurality of light receiving elements having different sensitivities.

FIGS. 6A and 6B are diagrams illustrating examples of the pixel 20a including the light receiving elements 401a and 401b having different sensitivities. In FIGS. 6A and 6B, the light receiving elements 401a and 401b are also described as $PD_1$ and $PD_2$, respectively.

FIG. 6A is an example in which a sensitivity difference is generated by setting light receiving units of the light receiving elements 401a and 401b to have different areas. In the example of FIG. 6A, the area of the light receiving unit of the light receiving element 401a is smaller than the area of the light receiving unit of the light receiving element 401b. In this case, when the light rays having the same amount of light are incident on the light receiving elements 401a and 401b, photoelectric conversion in the light receiving element 401a is performed less than in the light receiving element 401a. Accordingly, the light sensitivity of the light receiving element 401a is lower than that of the light receiving element 401b.

FIG. 6B illustrates an example in which the light receiving elements 401a and 401b have the same configuration, and the areas of the light receiving units are the same, whereas a part of the light receiving unit of the light receiving element 401a (half in the example of FIG. 6B) is shielded by a mask or the like. In this case, the light applied to the light receiving element 401a is incident on the light receiving unit in an opening region A, and is not incident on the light receiving unit in a light shielding region B. Accordingly, the light sensitivity of the light receiving element 401a is lower than that of the light receiving element 401b by setting the light receiving units of the light receiving elements 401a and 401b to have substantially different areas as in the example of FIG. 6A.

Figure 7:
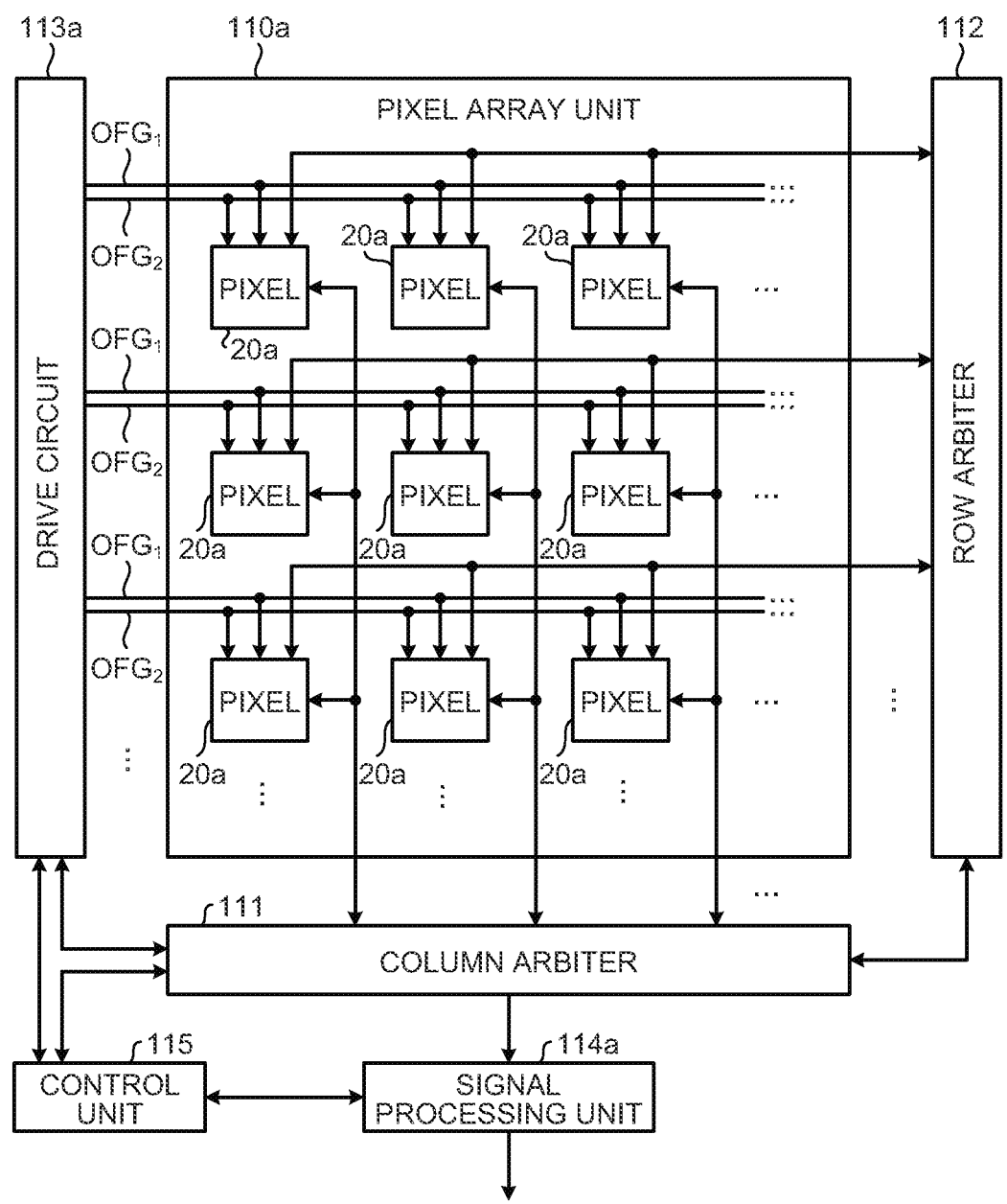
FIG. 7 is a schematic diagram illustrating an example of wirings in the pixel array unit according to the first embodiment.

FIG. 7 is a schematic diagram illustrating an example of wirings in the pixel array unit 110a according to the first embodiment. The drive circuit 113a generates the signals $OFG_1$ and $OFG_2$ under the control of the control unit 115, and supplies the generated signals $OFG_1$ and $OFG_2$ to each pixel 20a. In the example of FIG. 7, the drive circuit 113a generates the signals $OFG_1$ and $OFG_2$ for each row for each of the pixels 20a arrayed in the two-dimensional lattice in the pixel array unit 110a.

The pixels 20a are connected to the row arbiter 112 in units of rows in order to transmit and receive the requests and the responses. At this time, the pixels 20a are connected to the column arbiter 111 in units of columns in order to transmit and receive the requests and the responses and supply the event detection signal indicating the detection of the event and the address information.

For example, the column arbiter 111 supplies the event detection signal and the address information supplied from the pixel 20a to the control unit 115. The control unit 115 specifies the row in which the high and low states of the signals $OFG_1$ and $OFG_2$ need to be switched based on the event detection signal and the address information supplied from the column arbiter 111. The control unit 115 supplies an instruction to switch between the high and low states of the signals $OFG_1$ and $OFG_2$ in the specified row to the drive circuit 113a. The drive circuit 113a switches between the high and low states of the signals $OFG_1$ and $OFG_2$ in the row according to this instruction.

Although the signals $OFG_1$ and $OFG_2$ are supplied in units of rows of the pixels 20a included in the pixel array unit 110a in the example of FIG. 7, the present invention is not limited thereto. For example, the signals $OFG_1$ and $OFG_2$ may be collectively supplied to all the pixels 20a included in the pixel array unit 110a, or the pixel array unit 110a may be divided into a plurality of blocks including a predetermined number of pixels 20a and the signals $OFG_1$ and $OFG_2$ may be supplied in units of blocks.

Figure 8:
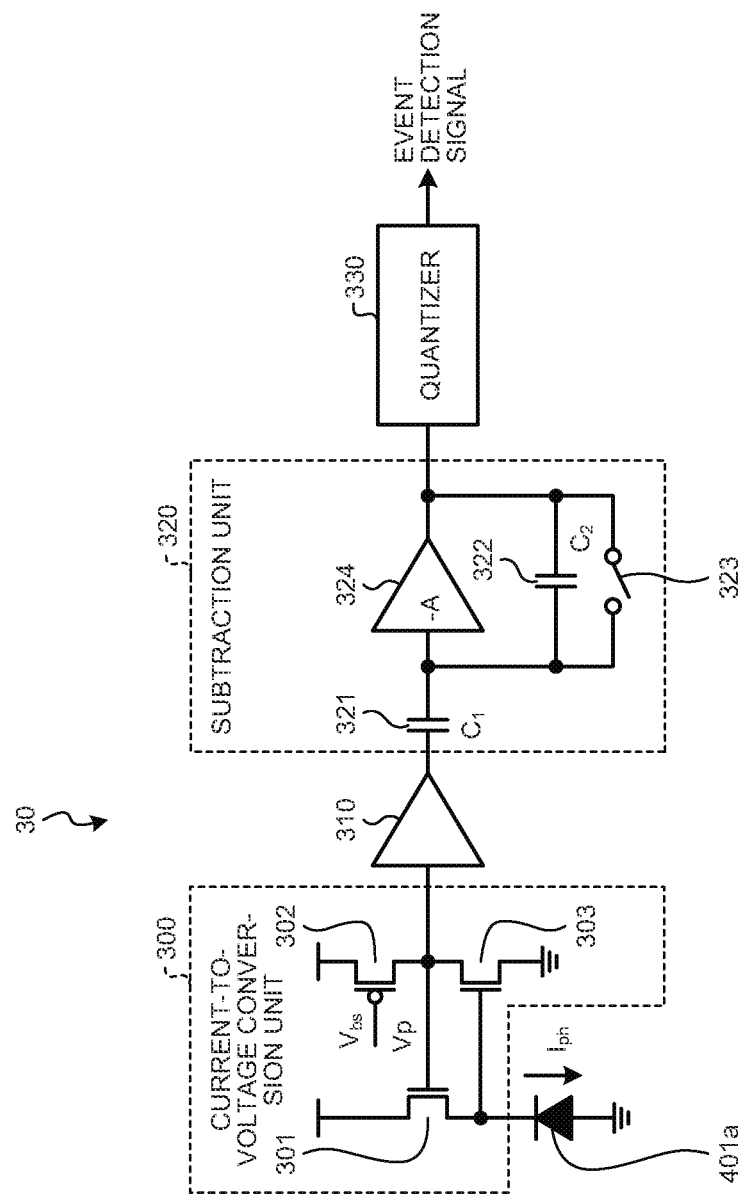
FIG. 8 is a diagram illustrating a configuration of an address event detection unit applicable to the first embodiment in more detail.

FIG. 8 is a diagram illustrating a configuration of the address event detection unit 30 applicable to the first embodiment in more detail. In FIG. 8, the address event detection unit 30 includes a current-to-voltage conversion unit 300, a buffer amplifier 310, a subtraction unit 320, and a quantizer 330.

The current-to-voltage conversion unit 300 includes transistors 301 and 303 which are N-type MOS transistors and a transistor 302 which is a P-type MOS transistor. Here, it is assumed that the light receiving element 401a is a photodiode. In FIG. 8, only the light receiving element 401a of the light receiving elements 401a and 401b included in the light receiving unit 40a is illustrated and the transistor 400a is not illustrated for the sake of convenience in description.

A source of the N-type transistor 301 is connected to the light receiving element 401a, and a drain is connected to a power supply terminal. The P-type transistor 302 and the N-type transistor 303 are connected in series between the power supply terminal and a ground terminal. A connection point between a drain of the transistor 302 and a drain of the transistor 303 is connected to a gate of the transistor 301 and an input terminal of the buffer amplifier 310. A predetermined bias voltage $V_{bs}$ is applied to a gate of the transistor 302.

The drains of the N-type transistors 301 and 303 are connected to a power supply side, and each form a source follower. The photocurrent output from the light receiving element 401a is converted into a logarithmic voltage signal by these two source followers connected in a loop. The transistor 302 supplies a constant current to the transistor 303.

The voltage signal obtained by converting the photocurrent output from the light receiving element 401a into the voltage by the current-to-voltage conversion unit 300 is supplied to the subtraction unit 320 via the buffer amplifier. The subtraction unit 320 includes capacitors 321 and 322 having capacitances $C_1$ and $C_2$, a switch unit 323, and an inverter 324.

One terminal of the capacitor 321 is connected to an output terminal of the buffer amplifier, and the other terminal is connected to an input terminal of the inverter 324. The capacitor 322 is connected in parallel with the inverter 324. The switch unit 323 switches a path connecting both terminals of the capacitor 322 between an ON state and an OFF state according to a row drive signal. The inverter 324 inverts the voltage signal input via the capacitor 321. The inverter 324 supplies the inverted signal to the quantizer 330.

When the switch unit 323 is in the ON state, a voltage signal $V_{init}$ which is an output signal of the buffer amplifier is input to a side of the capacitor 321 close to the buffer amplifier, and a side of the capacitor 321 close to the inverter 324 serves as a virtual ground terminal. A potential of this virtual ground terminal is set to zero for the sake of convenience in description. At this time, a charge $Q_{init}$ accumulated in the capacitor 321 is expressed by the following Equation (1) based on the capacitance $C_1$ of the capacitor 321. Meanwhile, since both terminals of the capacitor 322 are short-circuited by the switch unit 323, the accumulated charge becomes zero.

$$Q_{init} = C_1 \times V_{init} \tag{1}$$

Subsequently, it is assumed that the switch unit 323 is in the OFF state and the voltage on the side of the capacitor 321 close to the buffer amplifier changes to $V_{after}$. In this case, the charge $Q_{after}$ accumulated in the capacitor 321 is expressed by the following Equation (2).

$$Q_{after} = C_1 \times V_{after} \tag{2}$$

Meanwhile, when $V_{out}$ is an output voltage of the inverter 324, a charge $Q_2$ accumulated in the capacitor 322 is expressed by the following Equation (3).

$$Q_2 = -C_2 \times V_{out} \tag{3}$$

At this time, since the total amount of charges of the capacitors 321 and 322 does not change, a relationship of the following Equation (4) is established.

$$Q_{init} = Q_{after} + Q_2 \tag{4}$$

When Equations (1) to (3) are substituted into Equation (4) and Equation (4) is transformed, the following Equation (5) is obtained.

$$V_{out} = -(C_1/C_2) \times (V_{after} - V_{init}) \quad (5)$$

Equation (5) represents a subtraction operation of the voltage signal, and a gain of the subtraction result is a ratio $C_1/C_2$ of the capacitances of the capacitors 321 and 322. Usually, since it is desired that the gain is maximized, it is preferable that the capacitors are designed such that the capacitance $C_1$ of the capacitor 321 is large and the capacitance $C_2$ of the capacitor 322 is small. Meanwhile, when the capacitance $C_2$ of the capacitor 322 is too small, kTC noise may increase, and thus, there is a concern that noise characteristics deteriorate. Thus, the reduction of the capacitance $C_2$ of the capacitor 322 is limited to a range in which noise can be allowed. Since the address event detection unit 30 including the subtraction unit 320 is mounted on each pixel 20, the capacitances $C_1$ and $C_2$ of the capacitors 321 and 322 have restrictions on the areas. The values of the capacitances $C_1$ and $C_2$ of the capacitors 321 and 322 are determined in consideration of these restrictions.

The quantizer 330 detects three states of the up event, the down event, and no event detection by using two threshold values of the ON threshold value and the OFF threshold value. Thus, the quantizer 330 is called a 1.5-bit quantizer.

Event Detection Processing Applicable to Embodiment

Figure 9:
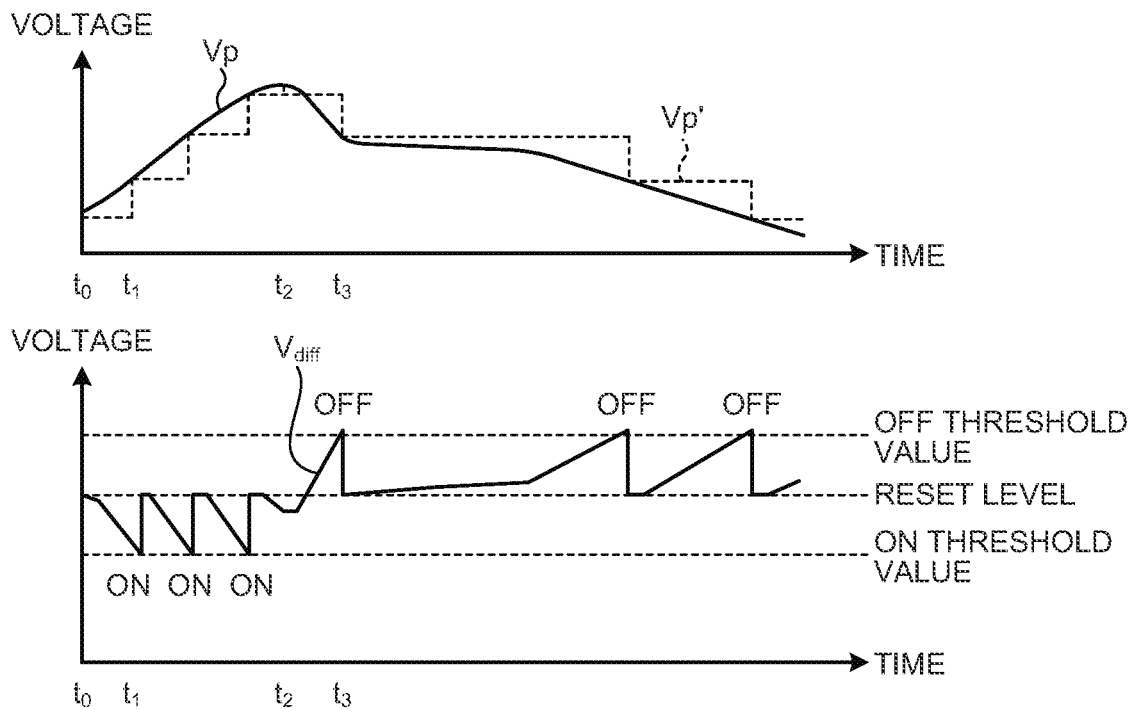
FIG. 9 is a diagram for describing an operation of the address event detection unit applicable to the first embodiment.

FIG. 9 is a diagram for describing an operation of the address event detection unit 30 illustrated in FIG. 8. In upper and lower diagrams of FIG. 9, a horizontal axis represents a time, and a vertical axis represents a voltage. The upper diagram of FIG. 9 illustrates an example of an output voltage Vp of the current-to-voltage conversion unit 300. The lower diagram of FIG. 9 illustrates a state of a voltage $V_{diff}$ which is an output voltage of the subtraction unit 320 corresponding to a change in the output voltage Vp on the upper side. The voltage $V_{diff}$ corresponds to the voltage $V_{out}$ in Equation (5).

On the lower side of FIG. 9, the OFF threshold value and the ON threshold value are threshold values for the voltage $V_{diff}$ for detecting the down event and the up event, respectively. When the voltage $V_{diff}$ exceeds the OFF threshold value in a positive direction, the up event is detected, and when the voltage $V_{diff}$ exceeds the ON threshold value in a negative direction, the down event is detected. When the voltage $V_{diff}$ is less than the OFF threshold value and exceeds the ON threshold value, the event is not detected.

The output voltage Vp output from the current-to-voltage conversion unit 300 is input to the subtraction unit 320 via the buffer amplifier. First, for example, a case where the amount of light received by the light receiving element 401a increases and the output voltage Vp output from the current-to-voltage conversion unit 300 increases will be described.

For the sake of convenience in description, in FIG. 9, it is assumed that a point in time $t_0$ is immediately after the switch unit 323 is switched from the ON state to the OFF state in the subtraction unit 320. That is, when the switch unit 323 is in the ON state, both the terminals of the capacitor 322 are short-circuited, and the capacitor 322 is reset. When the capacitor 322 is reset, the voltage $V_{diff}$ of the output of the subtraction unit 320 is set to a reset level. The row drive circuit 110 switches the switch unit 323 to the OFF state immediately after the voltage $V_{diff}$ of the output of the subtraction unit 320 is set to the reset level.

It is assumed that the output voltage Vp increases from this point in time $t_0$ and the voltage $V_{diff}$ which is a difference of the output voltage Vp from the output voltage Vp at the point in time $t_0$ exceeds the ON threshold value in the negative direction at a point in time $t_1$. In this case, the event detection signal indicating the up event detection is output from the quantizer 330. At this time, the switch unit 323 is switched to the ON state by the row drive circuit 110 according to this event detection signal, and the output of the subtraction unit 320 is set to the reset level. The row drive circuit 110 switches the switch unit 323 to the OFF state immediately after the output of the subtraction unit 320 is set to the reset level.

Next, a case where the amount of light received by the light receiving element 401a decreases and the output voltage Vp output from the current-to-voltage conversion unit 300 decreases will be described. In the example on the upper side of FIG. 9, the output voltage Vp is changed from an increase to a decrease at a point in time $t_2$, and at a point in time $t_3$, a difference between the output voltage Vp at the point in time $t_3$ and the output voltage Vp when it is determined to exceed the threshold value (in this case, the ON threshold value) immediately before the point in time $t_3$ exceeds the OFF threshold value in the positive direction. Accordingly, the event detection signal indicating the down event detection is output from the quantizer 330. At this time, the switch unit 323 is switched to the ON state by the row drive circuit 110 according to this event detection signal, and the output of the subtraction unit 320 is set to the reset level. The row drive circuit 110 switches the switch unit 323 to the OFF state immediately after the output of the subtraction unit 320 is set to the reset level.

The address event detection unit 30 can output the event detection signal corresponding to a change in the amount of light received by the light receiving element 401a by comparing the difference of the output voltage Vp of the current-to-voltage conversion unit 300 with the ON threshold value and the OFF threshold value as described above.

A voltage Vp' is obtained by rewriting the change in the output voltage Vp of the current-to-voltage conversion unit 300 on the upper side of FIG. 9 according to the lower side of FIG. 9, that is, the output of the quantizer 330. In other words, the quantizer 330 detects rising and falling of the change in the voltage Vp' for each of the ON threshold value and the OFF threshold value from the determination result using the ON threshold value and the OFF threshold value based on a change in the voltage Vp' and the voltage $V_{diff}$.

More Detailed Description of First Embodiment

Figure 10:
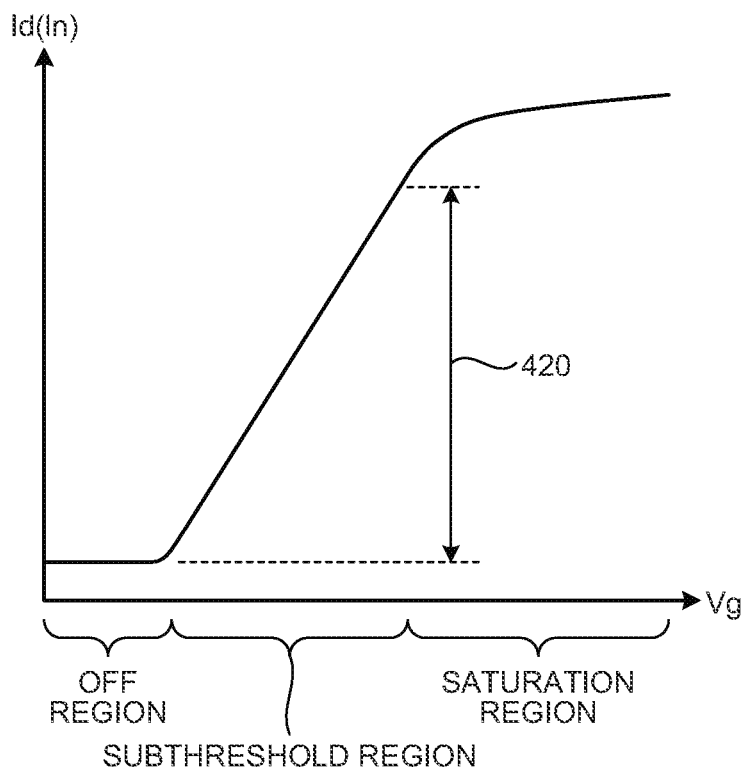
FIG. 10 is a diagram illustrating an example of Vg-Id characteristics of a transistor used in a current-to-voltage conversion unit according to the first embodiment.

Next, an operation of the solid-state imaging device 11a according to the first embodiment will be described in more detail. FIG. 10 is a diagram illustrating an example of Vg-Id characteristics of the transistor 301 which the N-type MOS transistor used in the current-to-voltage conversion unit 300 (see FIG. 8) according to the first embodiment. In FIG. 10, a horizontal axis represents a gate voltage Vg, and a vertical axis represents a drain current Id(ln) in logarithmic notation.

As illustrated in FIG. 10, the Vg-Id characteristics of the transistor 301 shift from an OFF region to a subthreshold region, and further shift from the subthreshold region to a saturation region as the gate voltage Vg increases. The OFF region is a region in which the drain current Id is substantially constant as the gate voltage Vg increases. The subthreshold region is a region in which the drain current Id increases logarithmically as the gate voltage Vg increases.

The saturation region is a region in which the drain current Id increases substantially linearly as the gate voltage Vg increases.

The current-to-voltage conversion unit 300 converts the photocurrent Iph output from the light receiving element 401a into a voltage by logarithmic conversion by using the characteristics of the subthreshold region, and obtains the output voltage Vp. Accordingly, a range 420 corresponding to a range of the gate voltage Vg in the subthreshold region is a detection range of the photocurrent Iph output from the light receiving element 401a. As described above, a light detection range (dynamic range) in the address event detection unit 30 is limited to a current range of the subthreshold region of the transistor that performs current-to-voltage conversion.

Figure 11:
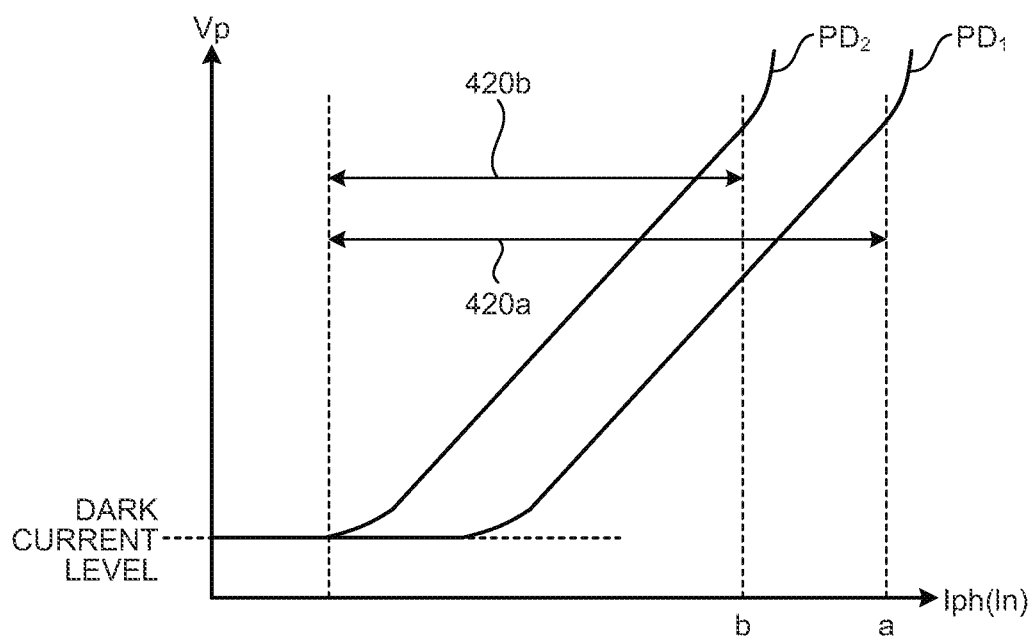
FIG. 11 is a diagram illustrating an example of input and output characteristics of the current-to-voltage conversion unit applicable to the first embodiment.

FIG. 11 is a diagram illustrating an example of input and output characteristics of the current-to-voltage conversion unit 300 applicable to the first embodiment. A horizontal axis represents the photocurrent Iph output from the light receiving element 401a or 401b in logarithmic notation, and a vertical axis represents the output voltage Vp of the current-to-voltage conversion unit 300. FIG. 11 corresponds to a diagram in which the vertical axis and the horizontal axis of the graph of FIG. 10 are replaced.

In FIG. 11, characteristic lines $PD_1$ and $PD_2$ illustrate a characteristic example of the low-sensitivity light receiving element 401a and a characteristic example of the normal-sensitivity light receiving element 401b described with reference to FIG. 5, respectively. In FIG. 11, a dark current level is a voltage level obtained by converting dark currents generated in the light receiving elements 401a and 401b into voltages. As illustrated by the characteristic lines $PD_1$ and $PD_2$, the dark current level becomes a lower limit value of the output voltage Vp of the current-to-voltage conversion unit 300.

As described above, the current value of the photocurrent $Iph_1$ output when the light having the same amount of light as that of the normal-sensitivity light receiving element 401b is incident on the low-sensitivity light receiving element 401a is smaller than the current value of the photocurrent $Iph_2$ output from the light receiving element 401b. That is, the photocurrent $Iph_1$ to be output is small even though a large amount of light is incident on the low-sensitivity light receiving element 401a. Thus, the characteristic line $PD_1$ of the light receiving element 401a shifts with respect to the characteristic line $PD_2$ of the light receiving element 401b in a direction in which the photocurrent Iph is large (rightward in FIG. 11).

In other words, in the Id-Vg characteristics of the transistor 301, a current value a of the photocurrent $Iph_1$ using the light receiving element 401a corresponding to a voltage at a saturation point that shifts from the subthreshold region to the saturation region shifts with respect to a current value b of the photocurrent $Iph_2$ using the light receiving element 401b in a direction in which the photocurrent is large. In the first embodiment, light detection for the address event detection is executed by using the low-sensitivity light receiving element 401a and the normal-sensitivity light receiving element 401b in combination. Accordingly, as illustrated in FIG. 11, it is possible to extend a light detection range 420b using only the normal-sensitivity light receiving element 401b to a light detection range 420a including a light detection range using the low-sensitivity light receiving element 401a.

Figure 12A:
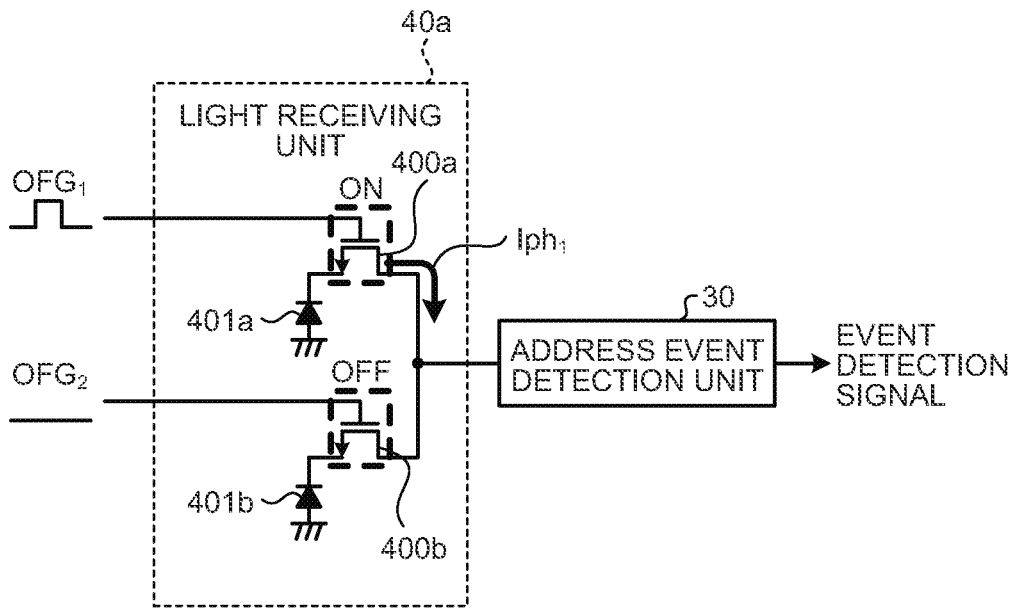
FIG. 12A is a diagram for describing control for detecting an address event by using a low-sensitivity light receiving element and a normal-sensitivity light receiving element according to the first embodiment.
Figure 12B:
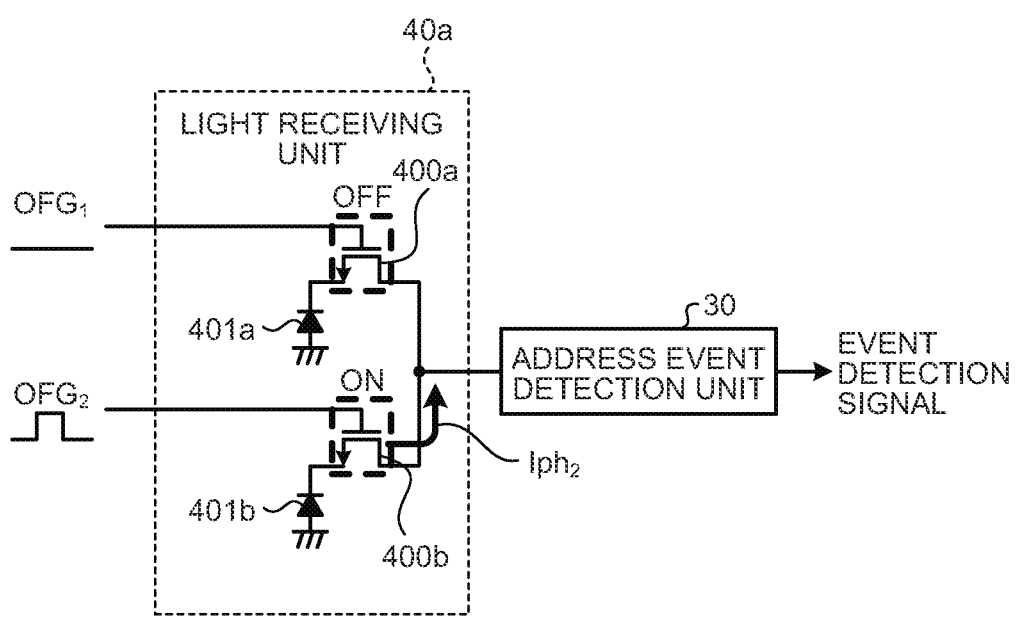
FIG. 12B is a diagram for describing control for detecting the address event by using the low-sensitivity light receiving element and the normal-sensitivity light receiving element according to the first embodiment.

FIGS. 12A and 12B are diagrams for describing control for detecting the address event by using the low-sensitivity light receiving element 401a and the normal-sensitivity light receiving element 401b according to the first embodiment.

FIG. 12A illustrates an example in which the address event detection unit 30 detects the address event based on the photocurrent $Iph_1$ output from the light receiving element 401a. As illustrated in FIG. 12A, the signal $OFG_1$ supplied to the gate of the transistor 400a is set to the high state, and the signal $OFG_2$ supplied to the gate of the transistor 400b is set to the low state. Accordingly, the transistor 400a is turned on, the transistor 400b is turned off, and the photocurrent $Iph_1$ of the photocurrent $Iph_1$ output from the light receiving element 401a and the photocurrent $Iph_2$ output from the light receiving element 401b is supplied to the address event detection unit 30 through the transistor 400a.

FIG. 12B illustrates an example in which the address event detection unit 30 detects the address event based on the photocurrent $Iph_2$ output from the light receiving element 401b. As illustrated in FIG. 12B, the signal $OFG_1$ supplied to the gate of the transistor 400a is set to the low state, and the signal $OFG_2$ supplied to the gate of the transistor 400b is set to the high state. Accordingly, the transistor 400a is turned off, the transistor 400b is turned on, and the photocurrent $Iph_2$ of the photocurrent $Iph_1$ output from the light receiving element 401a and the photocurrent $Iph_2$ output from the light receiving element 401b is supplied to the address event detection unit 30 through the transistor 400b.

As stated above, the address event detection unit 30 outputs the event detection signal based on a photocurrent $Iph_{det}$ of the photocurrents $Iph_1$ and $Iph_2$ selected according to the signals $OFG_1$ and $OFG_2$.

Next, processing of selecting the photocurrent $Iph_{det}$ used by the address event detection unit 30 in order to detect the address event from the photocurrent $Iph_1$ output from the light receiving element 401a and the photocurrent $Iph_2$ output from the light receiving element 401b according to the first embodiment will be described.

In the first embodiment, the photocurrent $Iph_{det}$ is selected based on the photocurrents $Iph_1$ and $Iph_2$ by limiting the output voltage Vp of the current-to-voltage conversion unit 300 by using a limiter.

Figure 13:
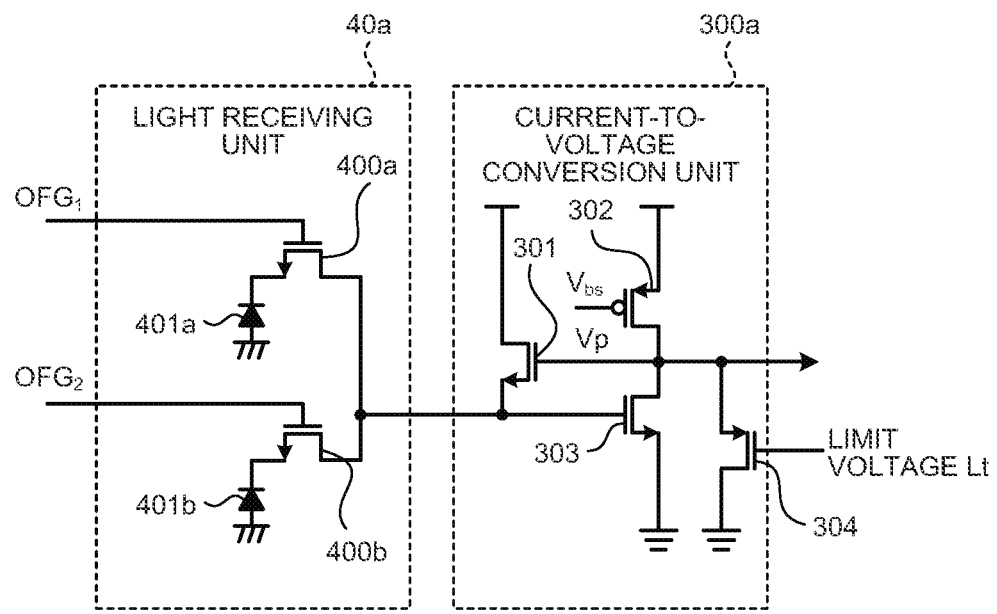
FIG. 13 is a diagram illustrating an example of a configuration of the current-to-voltage conversion unit to which a limiter is applied according to the first embodiment.

FIG. 13 is a diagram illustrating an example of a configuration of a current-to-voltage conversion unit 300a to which the limiter is applied according to the first embodiment. In FIG. 13, the buffer amplifier 310, the subtraction unit 320, and the quantizer 330 in the address event detection unit 30 illustrated in FIG. 8 are omitted.

In FIG. 13, the current-to-voltage conversion unit 300a according to the first embodiment has a configuration in which a transistor 304 which is a P-type MOS transistor is added as the limiter to the current-to-voltage conversion unit 300 of FIG. 8. More specifically, a source of the transistor 304 is connected to an output path of an event detection signal of the current-to-voltage conversion unit 300a, that is, connection points between the drains of the transistors 302 and 303 and the gate of the transistor 301, and a drain of the transistor 304 is connected to the ground.

In this configuration, a predetermined limit voltage Lt is supplied to the gate of the transistor 304, and thus, an upper limit of the voltage value of the event detection signal output from the current-to-voltage conversion unit 300a can be limited to a voltage corresponding to the limit voltage Lt. In the following description, it is assumed that the upper limit of the voltage value of the event detection signal output from the current-to-voltage conversion unit 300a is limited to the limit voltage Lt.

Figure 14:
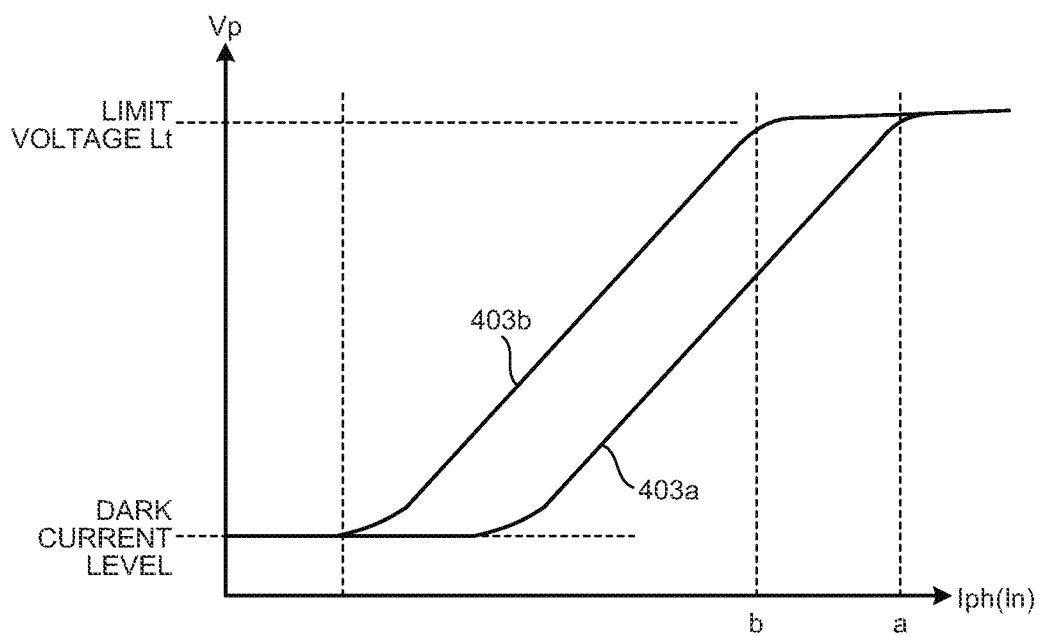
FIG. 14 is a diagram illustrating an example of the input and output characteristics of the current-to-voltage conversion unit according to the first embodiment.

FIG. 14 is a diagram illustrating an example of input and output characteristics of the current-to-voltage conversion unit 300a according to the first embodiment. Similar to FIG. 11, a horizontal axis represents the photocurrent Iph output from the light receiving element 401a or 401b in logarithmic notation, and a vertical axis represents the output voltage Vp of the current-to-voltage conversion unit 300. As illustrated in FIG. 14, the input and output characteristics of the current-to-voltage conversion unit 300a are characteristics obtained by limiting the output voltage Vp in the input and output characteristics of the current-to-voltage conversion unit 300 of FIG. 11 by the limit voltage Lt.

That is, as illustrated by a characteristic line 403a in FIG. 14, the output voltage Vp based on the photocurrent $Iph_1$ of the low-sensitivity light receiving element 401a is limited to the limit voltage Lt at the current value a of the photocurrent $Iph_1$ using the light receiving element 401a corresponding to the voltage at the saturation point that shifts from the subthreshold region to the saturation region in the Id-Vg characteristics of the transistor 301. Similarly, the output voltage Vp based on the photocurrent $Iph_2$ of the light receiving element 401b with normal sensitivity is also limited to the limit voltage Lt at the current value b of the photocurrent $Iph_2$ by the light receiving element 401b corresponding to the voltage at the saturation point.

In the solid-state imaging device 11a according to the first embodiment, the photocurrent $Iph_{det}$ used for the address event detection is switched between the photocurrent $Iph_1$ output from the low-sensitivity light receiving element 401a and the photocurrent $Iph_2$ output from the normal-sensitivity light receiving element 401b by using a mechanism of the address event detection processing. The switching processing according to the first embodiment will be described with reference to FIGS. 15 to 18. Here, it is assumed that the signal $OFG_1$ is in the high state as an initial state and the photocurrent $Iph_1$ output from the low-sensitivity light receiving element 401a is supplied to the address event detection unit 30a.

Figure 15:
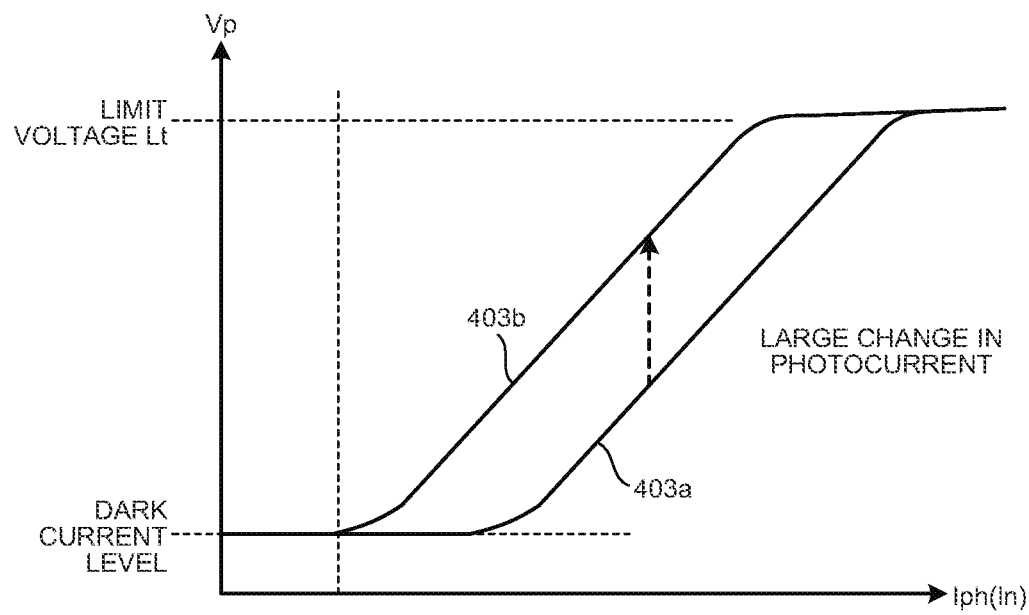
FIG. 15 is a diagram for describing an example in which it is not necessary to switch between the light receiving elements to be used in address event detection processing according to the first embodiment.

First, an example in which it is not necessary to switch between the light receiving elements used for the address event detection processing will be described with reference to FIGS. 15 and 16. FIG. 15 is a diagram illustrating an example of the change in the photocurrent $Iph_1$ output from the low-sensitivity light receiving element 401a. In the example of FIG. 15, both ends of the change in the photocurrent $Iph_1$ do not reach both ends of the detection range defined by the dark current level and the limit voltage Lt.

Figure 16:
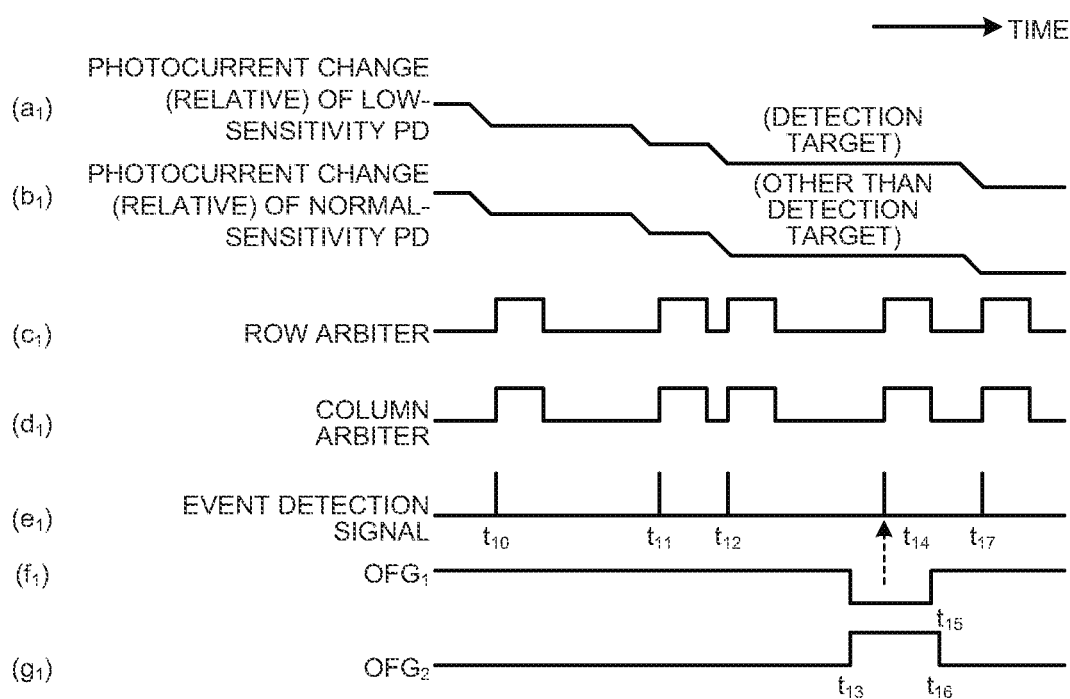
FIG. 16 is a diagram for describing an example in which it is not necessary to switch between the light receiving elements to be used in the address event detection processing according to the first embodiment.

FIG. 16 is a timing chart illustrating an example of processing in the solid-state imaging device 11a corresponding to the change in the photocurrent $Iph_1$ of FIG. 15. In FIG. 16, a chart ($a_1$) illustrates an example of the change in the photocurrent $Iph_1$ output from the low-sensitivity light receiving element 401a (low-sensitivity PD). At this time, the photocurrent $Iph_2$ is also output from the normal-sensitivity light receiving element 401b (normal-sensitivity PD), and an example of the change in the photocurrent $Iph_2$ is illustrated in a chart ($b_1$) of FIG. 16.

These charts ($a_1$) and ($b_1$) relatively illustrate the changes in the photocurrents $Iph_1$ and $Iph_2$. Relative changes in the amount of light received by the low-sensitivity PD and the amount of light received by the normal-sensitivity PD correspond to each other, and the change in the photocurrent $Iph_1$ of the low-sensitivity PD and the change in the photocurrent $Iph_2$ of the normal-sensitivity PD are relatively equal as illustrated in the charts ($a_1$) and ($b_1$). Meanwhile, absolute values of the photocurrent $Iph_1$ and the photocurrent $Iph_2$ at the same timing are different, and, for example, the absolute value of the photocurrent $Iph_2$ is larger than the absolute value of the photocurrent $Iph_1$.

In FIG. 16, a chart ($e_1$) illustrates an example of the event detection signal output from the address event detection unit 30a. In this example, the event detection signal corresponding to the change in the photocurrent $Iph_1$ of the low-sensitivity PD illustrated in the chart ($a_1$) is output at points in time $t_{10}$, $t_{11}$, and $t_{12}$. Charts ($c_1$) and ($d_1$) illustrate examples of arbitration for the event detection signal output from the pixel 20a including the low-sensitivity PD and the normal-sensitivity PD in the row arbiter 112 and the column arbiter 111, respectively. The event detection signal illustrated in the chart ($e_1$) is selected in the high state.

In FIG. 16, charts ($f_1$) and ($g_1$) illustrate states of the signals $OFG_1$ and $OFG_2$, respectively. Initially, the signal $OFG_1$ is in the high state, the signal $OFG_2$ is in the low state, and the photocurrent $Iph_1$ output from the low-sensitivity PD illustrated in the chart ($a_1$) is supplied to the address event detection unit 30.

Here, for example, it is assumed that the amount of change in the photocurrent $Iph_1$ in the low-sensitivity PD exceeds a predetermined amount during a period from the point in time $t_{12}$ to a point in time $t_{13}$. For example, the control unit 115 acquires the event detection signal from the column arbiter 111, and predicts the photocurrent $Iph_1$ in the low-sensitivity PD and the amount of change in the photocurrent $Iph_1$ based on the acquired event detection signal. When the predicted amount of change in the photocurrent $Iph_1$ exceeds the predetermined amount, the control unit 115 switches the signal $OFG_1$ to the low state and the signal $OFG_2$ to the high state (point in time $t_{13}$). Accordingly, the photocurrent $Iph_2$ of the normal-sensitivity PD is supplied to the address event detection unit 30.

In this case, the address event detection unit 30 obtains, as the amount of change in the photocurrent Iph, a result obtained by comparing the photocurrent $Iph_1$ of the low-sensitivity PD immediately before the signals $OFG_1$ and $OFG_2$ are switched at the point in time $t_{13}$ with the photocurrent $Iph_2$ of the normal-sensitivity PD in a state in which the signals $OFG_1$ and $OFG_2$ are switched at the point in time $t_{13}$. The address event detection unit 30 detects the down event when the amount of change exceeds the OFF threshold value in the positive direction, and detects the up event when the amount of change exceeds the ON threshold value in the negative direction (see FIG. 9).

In the example of FIG. 16, the address event detection unit 30 detects the up event when the amount of change exceeds the OFF threshold value in the positive direction, and outputs the event detection signal (point in time $t_{14}$. The column arbiter 111 and the row arbiter 112 select the event detection signal at this point in time $t_{14}$. When the event detection signal is acquired from the column arbiter 111, the control unit 115 returns the signal $OFG_1$ to the high state (point in time $t_{15}$), and returns the signal $OFG_2$ to the low state (point in time $t_{16}$). Thereafter, the address event detection unit 30 detects the address event by continuously using the low-sensitivity PD selected in the initial state (for example, point in time $t_{17}$).

Figure 17:
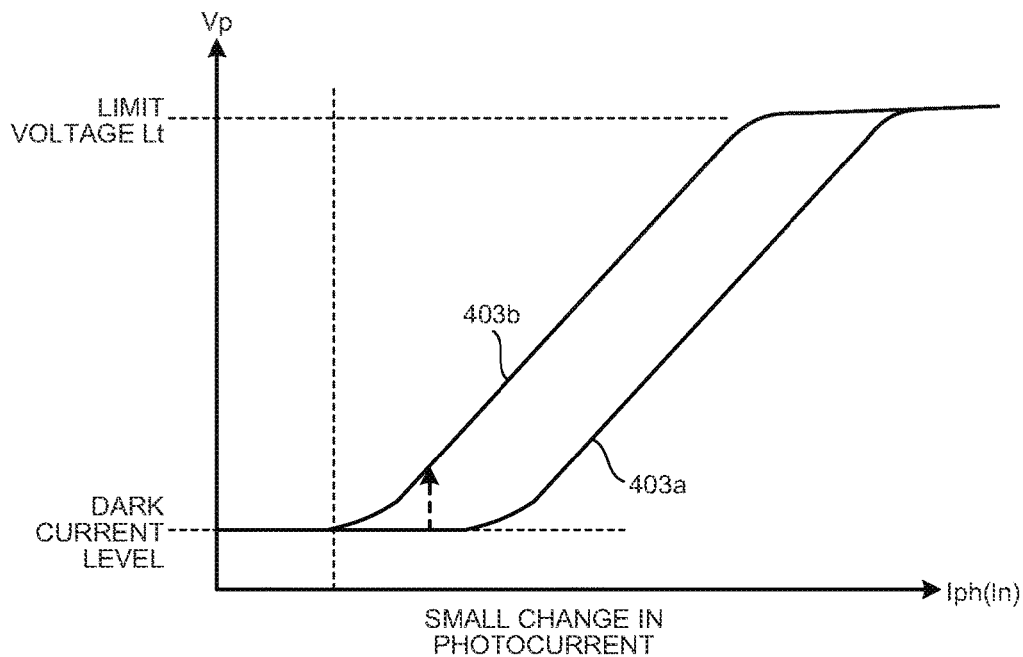
FIG. 17 is a diagram for describing an example in which it is necessary to switch the light receiving elements to be used in the address event detection processing according to the first embodiment.

Next, an example in which it is necessary to switch between the light receiving elements used for the address event detection processing will be described with reference to FIGS. 17 and 18. FIG. 17 is a diagram corresponding to FIG. 15 and illustrates an example of the change in the photocurrent $Iph_1$ output from the low-sensitivity light receiving element 401a. In the example of FIG. 17, a lower end of the change in the photocurrent $Iph_1$ reaches the dark current level. In this case, the amount of change in the amount of light that causes the change in the photocurrent $Iph_1$ may be larger than the amount of change in the amount of light indicated by the amount of change in the photocurrent $Iph_1$.

Figure 18:
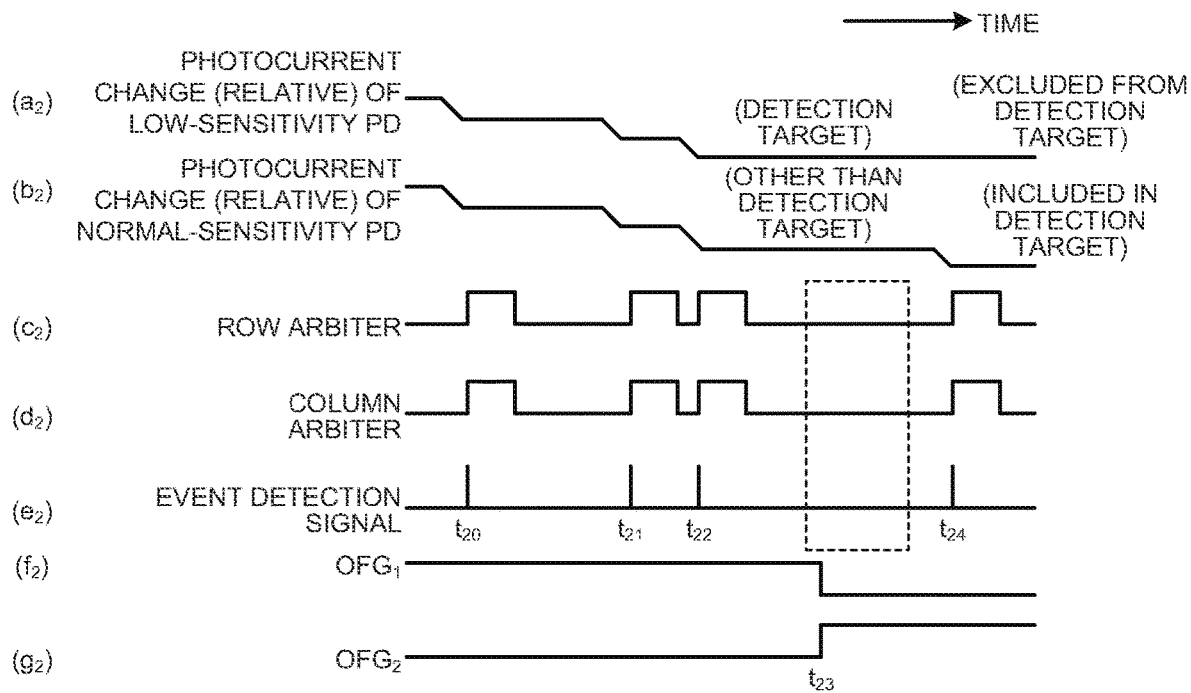
FIG. 18 is a diagram for describing an example in which it is necessary to switch between the light receiving elements to be used in the address event detection processing according to the first embodiment.

FIG. 18 is a timing chart illustrating an example of processing in the solid-state imaging device 11a corresponding to the change in the photocurrent $Iph_1$ of FIG. 17. Since the meanings of the charts ($a_2$) to ($g_2$) in FIG. 18 are the same as those of the charts ($a_1$) to ($g_1$) in FIG. 16, the description thereof is omitted here. As in the case of FIG. 16, in the example of FIG. 18, the event detection signal corresponding to the change in the photocurrent $Iph_1$ of the low-sensitivity PD is output at points in time $t_{20}$, $t_{21}$, and $t_{22}$ as illustrated in the chart ($e_2$).

In FIG. 18, the signal $OFG_1$ is initially in the high state, the signal $OFG_2$ is in the low state, and the photocurrent $Iph_1$ output from the low-sensitivity PD illustrated in the chart ($a_2$) is supplied to the address event detection unit 30 as illustrated in charts ($f_2$) and ($g_2$).

Here, for example, it is assumed that the amount of change in the photocurrent $Iph_1$ in the low-sensitivity PD exceeds a predetermined amount during a period from the point in time $t_{22}$ to a point in time $t_{23}$. For example, the control unit 115 predicts the photocurrent $Iph_1$ in the low-sensitivity PD and the amount of change in the photocurrent $Iph_1$ based on the event detection signal acquired from the column arbiter 111 as in the description of FIG. 16. When the predicted amount of change in the photocurrent $Iph_1$ exceeds the predetermined amount, the control unit 115 switches the signal $OFG_1$ to the low state and the signal $OFG_2$ to the high state (point in time $t_{23}$). Accordingly, the photocurrent $Iph_2$ of the normal-sensitivity PD is supplied to the address event detection unit 30.

In the example of FIG. 18, the address event detection unit 30 detects that the event is not detected when the amount of change does not exceed the ON threshold value and the OFF threshold value by a predetermined amount, and does not output the event detection signal as illustrated in a range surrounded by a dotted line in FIG. 18. Accordingly, the low-sensitivity PD is excluded from a target of the address event detection, and the normal-sensitivity PD is a target of the address event detection. In the example of FIG. 18, the address event detection unit 30 performs the address event detection based on the photocurrent $Iph_2$ of the normal-sensitivity PD illustrated in the chart ($b_2$) of FIG. 18, detects the down event when the amount of change exceeds the OFF threshold value in the positive direction at the point in time $t_{24}$, and outputs the event detection signal.

The column arbiter 111 and the row arbiter 112 select the event detection signal at this point in time $t_{24}$. The control unit 115 maintains the low state of the signal $OFG_1$ and the high state of the signal $OFG_2$ even though this event detection signal is acquired from the column arbiter 111, and performs the address event detection by using the normal-sensitivity PD switched from the low-sensitivity PD at the point in time $t_{23}$.

As described above, in the first embodiment, it is possible to execute control for switching the photocurrent $Iph_{det}$ used for the address event detection between the photocurrent $Iph_1$ output from the low-sensitivity PD (light receiving element 401a) and the photocurrent $Iph_2$ output from the normal-sensitivity PD (light receiving element 401b) by using the configuration for detecting the address event.

Modification Example of First Embodiment

Next, a modification example of the first embodiment will be described. In the first embodiment, the signals $OFG_1$ and $OFG_2$ are supplied in units of rows of the pixels 20a included in the pixel array unit 110a. Thus, the selected states of the signals $OFG_1$ and $OFG_2$ cannot be maintained in each pixel 20a. In the modification example of the first embodiment, it is possible to maintain the selected states of the signals $OFG_1$ and $OFG_2$ for each pixel 20a.

Figure 19:
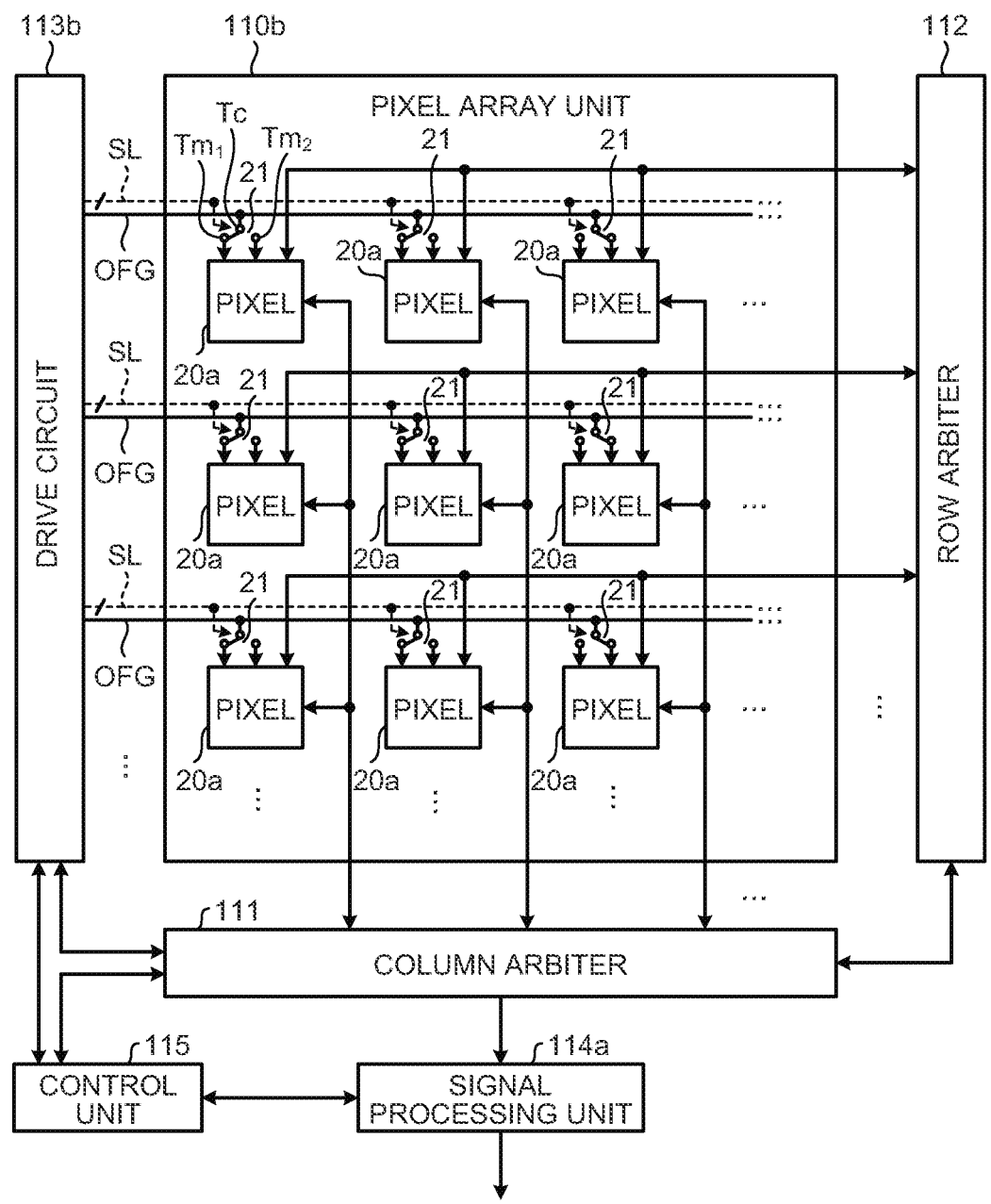
FIG. 19 is a schematic diagram illustrating an example of wirings in a pixel array unit according to a modification example of the first embodiment.

FIG. 19 is a schematic diagram illustrating an example of wirings in a pixel array unit 110b according to the modification example of the first embodiment. In FIG. 19, in the pixel array unit 110b, the pixels 20a are arrayed in a two-dimensional lattice, and terminals $Tm_1$ and $Tm_2$ of a switch 21 are connected to each pixel 20a. Referring to FIG. 5, for example, the terminal $Tm_1$ of the switch 21 is connected to the gate of the transistor 400a in the light receiving unit 40a included in the pixel 20a, and the terminal $Tm_2$ is connected to the gate of the transistor 400b in the light receiving unit 40a.

A drive circuit 113b generates the signal OFG in units of rows under the control of the control unit 115, and supplies the generated signal OFG to each pixel 20a via a common terminal Tc of the switch 21 connected to each pixel 20a. The switch 21 selects any one of the terminals $Tm_1$ and $Tm_2$ according to a selection signal SL supplied from the drive circuit 113b. The drive circuit 113b generates each selection signal SL corresponding to each pixel 20a under the control of the control unit 115, and supplies the selection signal to the switch 21 connected to each pixel 20a for each row. FIG. 19 illustrates that a plurality of selection signals SL is supplied as the selection signals SL.

In the above-described configuration, the selected states of the terminals $Tm_1$ and $Tm_2$ in each switch 21 corresponding to a certain selection signal SL are maintained until the next selection signal SL is supplied. Accordingly, in each pixel 20a, the selected state of the photocurrent $Iph_1$ using the low-sensitivity light receiving element 401a and the photocurrent $Iph_2$ using the normal-sensitivity light receiving element 401b can be maintained.

Although it has been described in the example of FIG. 19 that the switch 21 is provided outside the pixel 20a, the present invention is not limited to this example, and the switch 21 may be provided inside the pixel 20a. Although it has been described that the selection signal SL is supplied to each pixel 20a, the present invention is not limited to this example. For example, a logic circuit that switches between the terminals $Tm_1$ and $Tm_2$ of the switch 21 according to a specific bit string may be provided so as to correspond to each pixel 20a. By doing so, it is possible to reduce the number of signal lines for supplying the selection signals SL. Although it has been described that one switch 21 is connected to one pixel 20a, the present invention is not limited to this example, and one switch 21 can be shared by a plurality of pixels 20a.

Second Embodiment

Next, a second embodiment will be described. In the first embodiment, the plurality of light receiving elements having different sensitivities is arranged in one pixel. In contrast, in the second embodiment, a plurality of light receiving elements having substantially the same sensitivity is arranged in one pixel.

Figure 20:
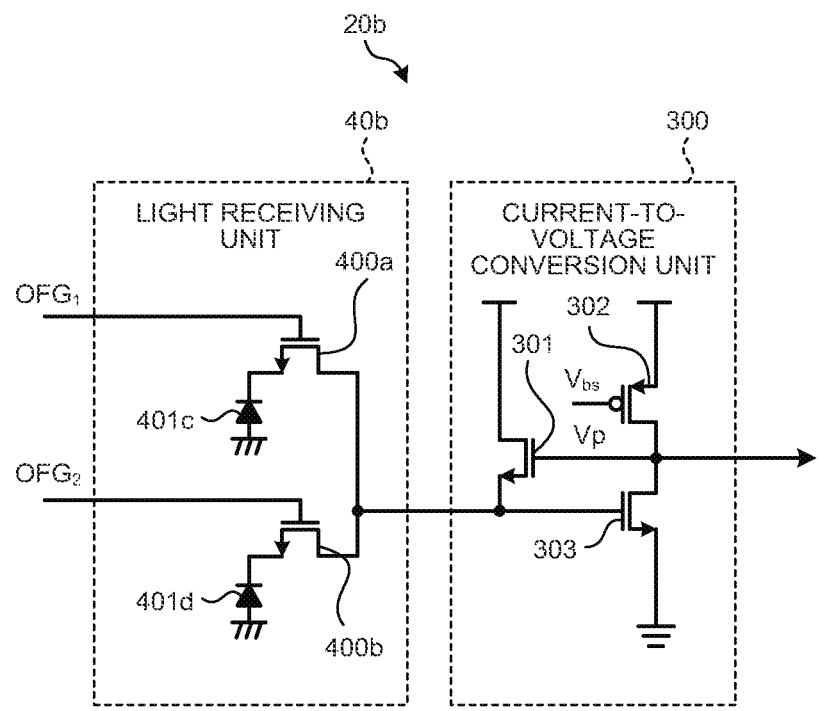
FIG. 20 is a diagram illustrating a configuration of an example of a pixel according to a second embodiment.

FIG. 20 is a diagram illustrating a configuration of an example of a pixel 20b according to the second embodiment. In FIG. 20, the pixel 20b includes a light receiving unit 40b and the current-to-voltage conversion unit 300. The current-to-voltage conversion unit 300 has the same configuration as the current-to-voltage conversion unit 300 described with reference to FIG. 8, and thus, the description thereof is omitted here. The limiter (transistor 304) described with reference to FIG. 13 may be added to the current-to-voltage conversion unit 300 of FIG. 20.

In FIG. 20, the light receiving unit 40b includes light receiving elements 401c and 401d having substantially the same sensitivity. Similar to the configuration of FIG. 5, in the light receiving element 401c, a cathode is connected to the ground, and an anode is connected to the source of the transistor 400a which is the N-type MOS transistor. The drain of the transistor 400a is connected to the connection point at which the source of the transistor 301 and the gate of the transistor 303 of the current-to-voltage conversion unit 300 are connected. The signal $OFG_1$ is supplied to the gate of the transistor 400a.

Similarly, in the light receiving element 401d, a cathode is grounded, and an anode is connected to the source of the transistor 400b which is the N-type MOS transistor. The drain of the transistor 400b is connected to the connection point at which the source of the transistor 301 and the gate of the transistor 303 of the current-to-voltage conversion unit 300 are connected in common with the drain of the transistor 400a. The signal $OFG_2$ is supplied to the gate of the transistor 400b.

Figure 21:
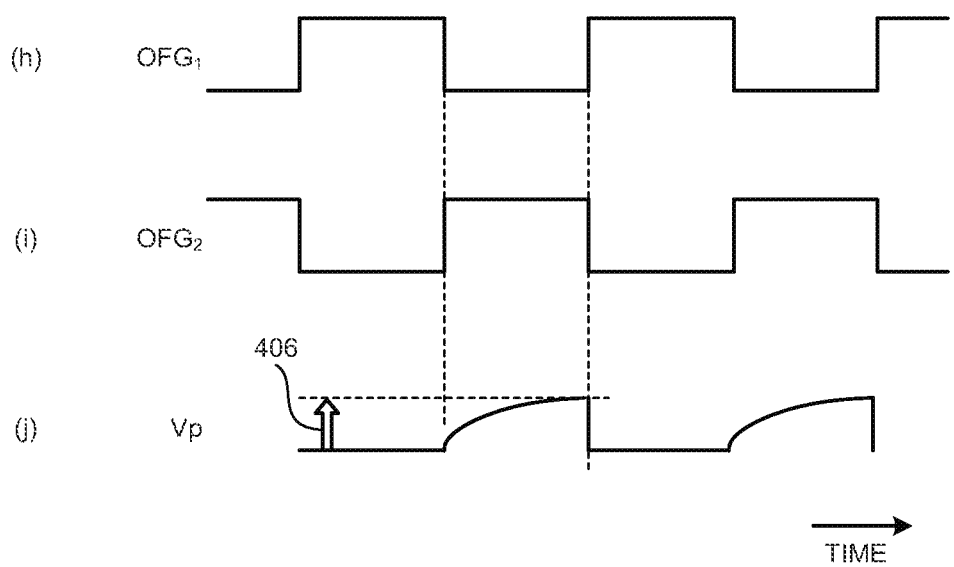
FIG. 21 is a time chart illustrating an example of a method of driving a light receiving unit according to the second embodiment.

FIG. 21 is a time chart illustrating an example of a method of driving the light receiving unit 40b according to the second embodiment. In FIG. 21, charts (h) and (i) illustrate states of the signals $OFG_1$ and $OFG_2$, respectively, and a chart (j) illustrates an output voltage Vp output from the current-to-voltage conversion unit 300.

In the second embodiment, the high state and low state of the signal $OFG_1$ and the high state and low state of the signal $OFG_2$ are alternately switched in a time division manner as illustrated in FIG. 21. For example, the control unit 115 acquires the output voltage Vp output from the current-to-voltage conversion unit 300 in synchronization with this switching timing, compares an output voltage $Vp_1$ when the signal $OFG_1$ is in the high state with an output voltage $Vp_2$ when the signal $OFG_2$ is in the high state, and obtains a difference 406 between the output voltages $Vp_1$ and $Vp_2$. This processing corresponds to the processing of obtaining the difference between the photocurrent $Iph_1$ output from the light receiving element 401c and the photocurrent $Iph_2$ output from the light receiving element 401d. The control unit 115 handles this difference 406 as the event detection signal, and analyzes this difference in the control unit 115 or outside.

Figure 22A:
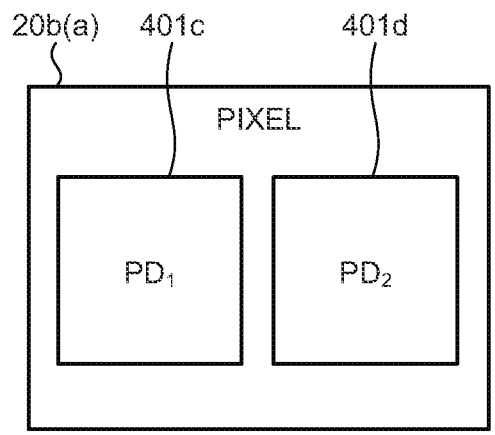
FIG. 22A is a diagram illustrating an example of a configuration of a light receiving element applicable to the second embodiment.
Figure 22B:
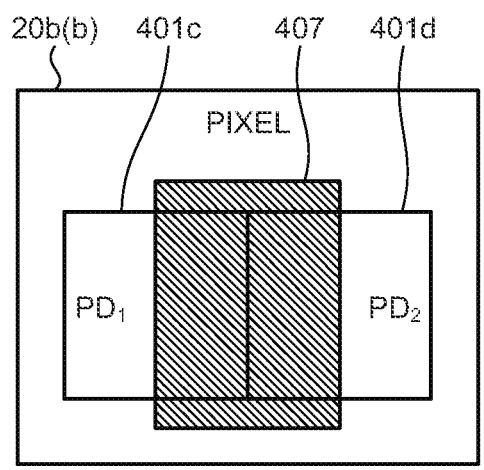
FIG. 22B is a diagram illustrating an example of the configuration of the light receiving element applicable to the second embodiment.
Figure 22C:
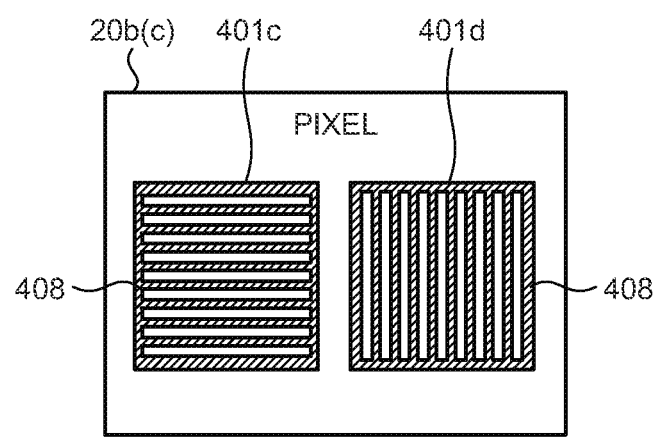
FIG. 22C is a diagram illustrating an example of the configuration of the light receiving element applicable to the second embodiment.

Various kinds of information can be obtained from the analysis result of the difference 406 by devising the configurations of the light receiving elements 401c and 401d. FIGS. 22A, 22B, and 22C are diagrams illustrating an example of the configuration of the light receiving elements 401c and 401d applicable to the second embodiment.

FIG. 22A illustrates an example of a pixel 20b(a) in which the light receiving elements 401c and 401d are arranged in parallel. In this case, information regarding an edge of the image can be acquired based on the difference 406. In this case, it is possible to perform edge detection with higher accuracy than in the case of using a pixel including only one light receiving element.

FIG. 22B illustrates an example of a pixel 20b(b) in which the light receiving elements 401c and 401d are arranged in parallel and adjacent to each other, and adjacent portions of the light receiving elements 401c and 401d are shielded by using a light shielding pattern 407. The light shielding pattern 407 is, for example, a metal light shielding pattern. In the pixel 20b(b) of FIG. 22B, the light incident on the pixel 20b(b) is received by the light receiving elements 401c and 401d through openings which are not shielded by the light shielding pattern 407.

Figure 23:
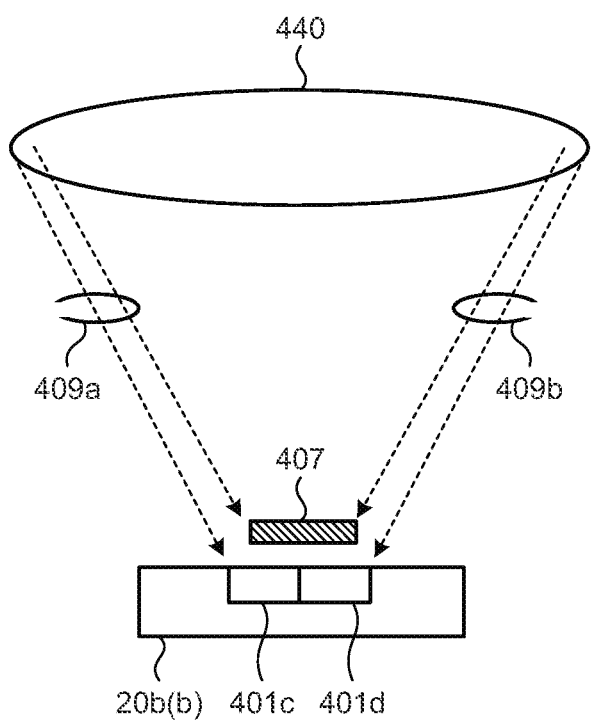
FIG. 23 is a schematic diagram illustrating a scene in which light is incident on a light receiving element in a pixel in which a light shielding pattern is provided.

FIG. 23 is a schematic diagram illustrating a scene in which the light is incident on the light receiving elements 401c and 401d in the pixel 20b(b) of FIG. 22B. In the example of FIG. 23, in the pixel 20b(b), the light shielding pattern 407 is provided on the light receiving elements 401c and 401d arranged adjacent to each other, and a lens 440 is provided so as to correspond to the pixel 20b(b). The lens 440 is, for example, an On Chip Lense (OCL).

The pixel 20b(b) is irradiated with the light incident on the lens 440. However, this light is shielded by the light shielding pattern 407, and is not incident on a right side of the light receiving element 401c and a left side of the light receiving element 401d in FIG. 23. Light 409a on the left side of the lens 440 in FIG. 23 is incident on the unshielded left side of the light receiving element 401c. Light 409b on the right side is incident on the unshielded right side of the light receiving element 401d.

Due to the use of this configuration, the pixel 20b(b) can be utilized as an image plane phase difference pixel. In general, the image plane phase difference pixel includes, for example, a set of two pixels of a pixel in which an opening filter having an opening on a left half region of the light receiving surface of the light receiving element is stacked and a pixel in which an opening filter having an opening on a right half region of the light receiving surface of another light receiving element is stacked. A distance is measured based on a phase difference between light rays received by the two pixels. Due to the use of the configuration of FIG. 22B, it is possible to form the image plane phase difference pixel by one pixel 20b(b).

FIG. 22C illustrates an example of the pixel 20b(c) in which polarization filters 408 are provided for the light receiving elements 401c and 401d in different polarization directions. The polarization filter 408 can be formed by the metal light shielding pattern in which a large number of slits for transmitting light are provided in parallel. As stated above, it is possible to detect polarization by one pixel 20b(c) by setting the polarization directions of the light receiving elements 401c and 401d included in the pixel 20b(c) to be different.

For example, in the configuration of the pixel 20b(a) of FIG. 22A, it is possible to detect the address event based on a difference between the photocurrent output from the light receiving element 401c and the photocurrent output from the light receiving element 401d.

That is, as described above, for example, the control unit 115 acquires the output voltage $Vp_1$ obtained by converting the photocurrent Iph output from the light receiving element 401c when the signal $OFG_1$ shifts from the high state to the low state. When the signal $OFG_1$ shifts the low state, the signal $OFG_2$ shifts the high state. When the signal $OFG_2$ shifts from the high state to the low state, the control unit 115 acquires the output voltage $Vp_2$ obtained by converting the photocurrent Iph output from the light receiving element 401d. It is assumed that the control unit 115 obtains the difference 406 between the output voltages $Vp_1$ and $Vp_2$ and detects the address event when the difference 406 exceeds the ON threshold value or the OFF threshold value in a predetermined direction.

As stated above, the pixel 20b including the light receiving elements 401c and 401d having the same sensitivity can be utilized for various purposes.

Third Embodiment

Next, a third embodiment will be described. In the first embodiment, the modification example thereof, and the second embodiment, the address event is detected based on the change in the photocurrent Iph output from the light receiving element. In the third embodiment, the address event is detected by further using a pixel signal corresponding to the absolute value of the photocurrent Iph output from the light receiving element.

Figure 24:
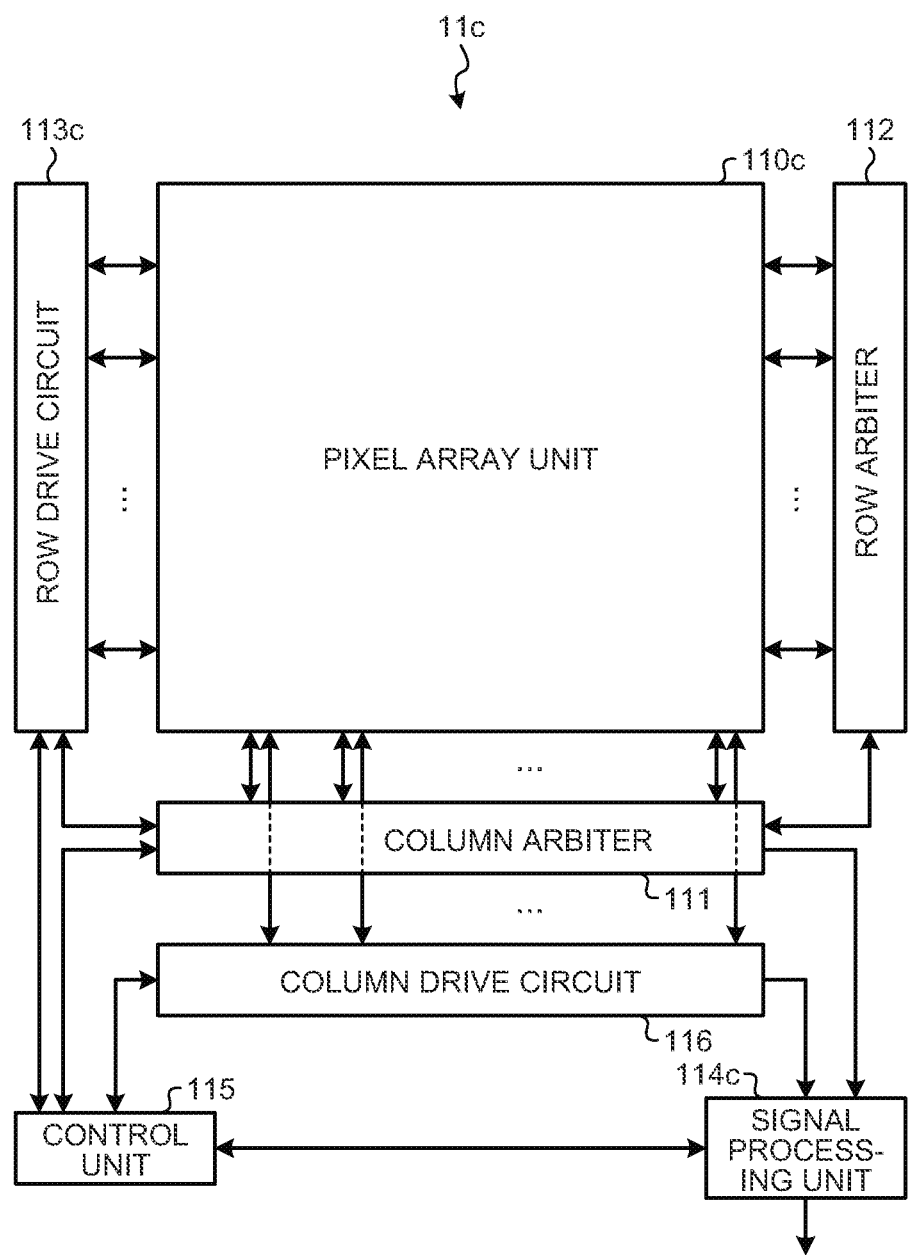
FIG. 24 is a block diagram illustrating a configuration of an example of a solid-state imaging device according to a third embodiment.

FIG. 24 is a block diagram illustrating a configuration of an example of a solid-state imaging device according to the third embodiment which corresponds to the solid-state imaging device 11 described with reference to FIG. 1. In FIG. 24, a solid-state imaging device 11c includes a pixel array unit 110c, the column arbiter 111, the row arbiter 112, a row drive circuit 113c, a signal processing unit 114c, the control unit 115, and a column drive circuit 116. The row drive circuit 113c includes the function of the drive circuit 113a illustrated in FIG. 2.

In the pixel array unit 110c, a plurality of pixels is arrayed in a two-dimensional lattice similarly to the pixel array unit 110a described with reference to FIG. 2. Each pixel includes the plurality of light receiving elements that outputs the photocurrents Iph corresponding to the received light rays, the address event detection unit that detects the address event based on the amount of changes in the photocurrents Iph output from the plurality of light receiving elements, and a pixel signal generation unit that generates pixel signals that are analog signals of voltages corresponding to the absolute value of the photocurrents Iph.

The row drive circuit 113c has a function of driving each pixel and outputting the pixel signal to the column drive circuit 116 in addition to the function of the drive circuit 113a of FIG. 2. The column drive circuit 116 includes an analog to digital (AD) converter for each column, and a drive circuit that scans the AD converter for each column in the row direction. The AD converter for each column is called a column AD converter (ADC). The column drive circuit 116 outputs the pixel signals converted into digital signals by the AD converters in units of rows by scanning the column ADC in the row direction. The pixel signal output from the column drive circuit 116 is supplied to the signal processing unit 114c.

The signal processing unit 114c executes predetermined signal processing such as correlated double sampling (CDS) processing and auto gain control (AGC) processing on the digital pixel signal supplied from the column drive circuit 116. Signal processing such as image recognition processing is executed on the event detection signal supplied from the column arbiter 111. The signal processing unit 114c supplies data indicating the processing result and the event detection signal to the storage unit 120.

Figure 25:
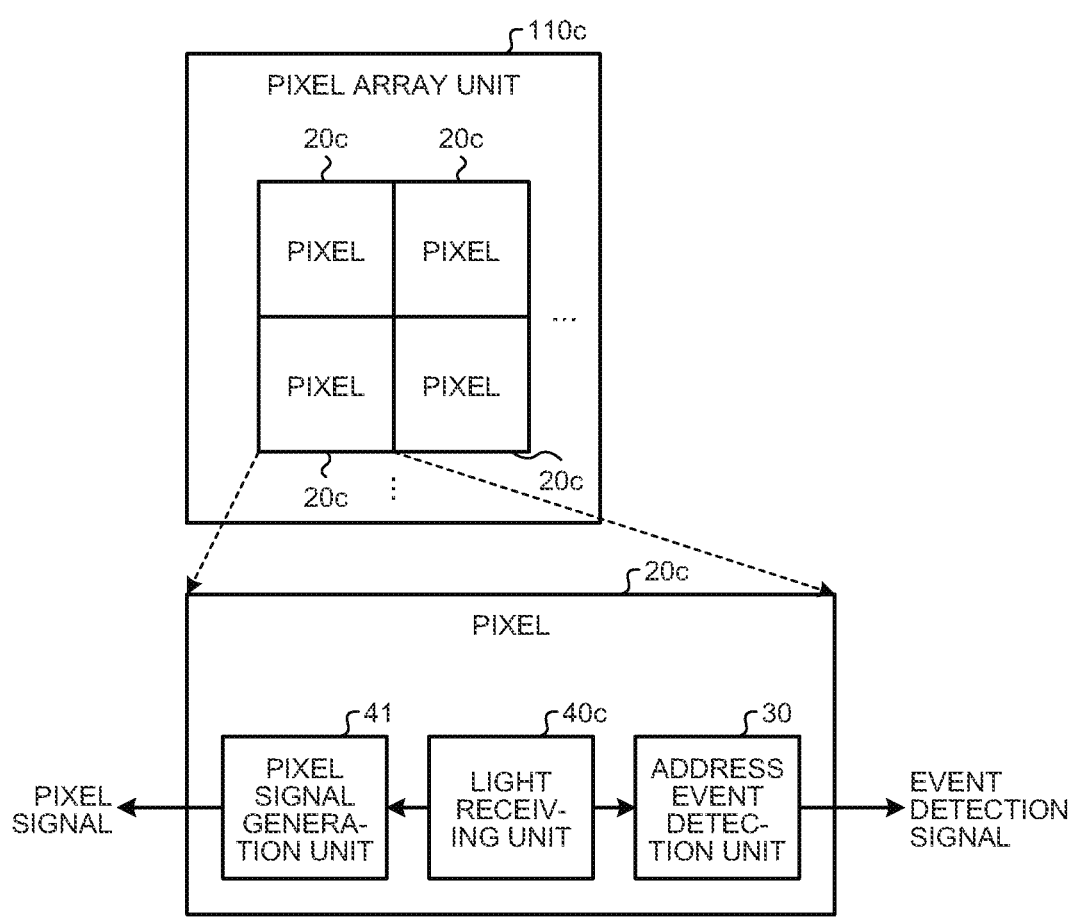
FIG. 25 is a block diagram illustrating a configuration of an example of a pixel array unit according to the third embodiment.

FIG. 25 is a block diagram illustrating a configuration of an example of the pixel array unit 110c according to the third embodiment. As illustrated on an upper side of FIG. 25, the pixel array unit 110c includes a plurality of pixels 20c arrayed in a two-dimensional lattice. As illustrated in a lower side of FIG. 25, each pixel 20c includes the address event detection unit 30, a light receiving unit 40c, and a pixel signal generation unit 41.

The light receiving unit 40c includes a plurality of light receiving elements, photoelectrically converts incident light, and generates the photocurrent Iph. The light receiving unit 40c supplies the generated photocurrent Iph to any of the pixel signal generation unit 41 and the address event detection unit 30 under the control of the row drive circuit 113c.

When the occurrence of the address event is detected, the address event detection unit 30 requests the column arbiter 111 and the row arbiter 112 to transmit the event detection signal indicating the occurrence of the address event. When a response to this request is received from the column arbiter 111 and the row arbiter 112, the address event detection unit 30 supplies the address detection signal to the row drive circuit 113c and the signal processing unit 114c.

The address event detection unit 30 includes the current-to-voltage conversion unit 300a described with reference to FIG. 13 that limits the upper limit of the output voltage Vp to the limit voltage Lt by the limiter.

The pixel signal generation unit 41 generates, as the pixel signal, a signal having a voltage corresponding to the photocurrent Iph supplied from the light receiving unit 40c. The pixel signal generation unit 41 supplies the generated pixel signal to the column drive circuit 116 via a vertical signal line.

Figure 26:
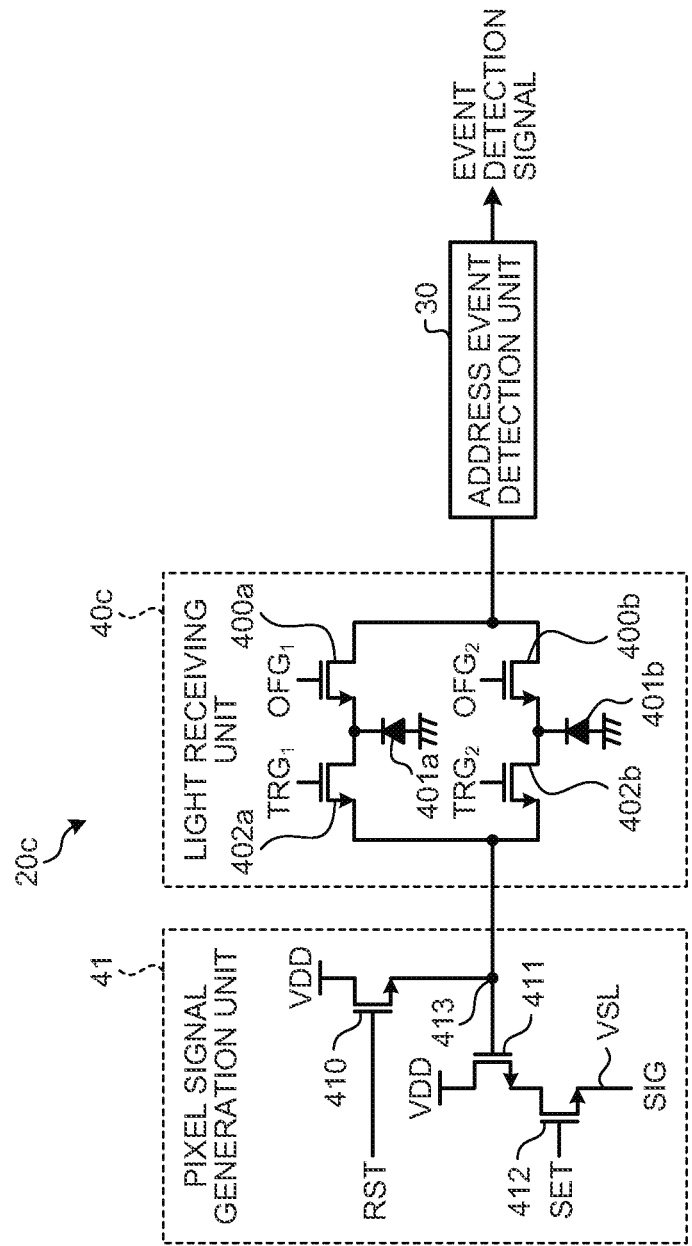
FIG. 26 is a diagram illustrating a configuration of an example of a pixel according to the third embodiment.

FIG. 26 is a diagram illustrating a configuration of an example of the pixel 20c according to the third embodiment. In FIG. 26, the light receiving unit 40c includes two light receiving elements 401a and 401b which are, for example, photodiodes, and transistors 400a, 400b, 402a and 402b which are N-type MOS transistors. The pixel signal generation unit 41 includes a floating diffusion layer 413, and a reset transistor 410, an amplification transistor 411, and a selection transistor 412 which are N-type MOS transistors, respectively.

In the light receiving element 401a of the light receiving unit 40c, a cathode is connected to the ground, and an anode is connected to a source of the transistor 400a which is the N-type MOS transistor and a drain of the transistor 402a which is the N-type MOS transistor. A drain of the transistor 400a is connected to the address event detection unit 30. A source of the transistor 402a is connected to the floating diffusion layer 413 in the pixel signal generation unit 41.

A signal $OFG_1$ is supplied to a gate of the transistor 400a. The transistor 400a is turned on when the signal $OFG_1$ is in the high state, and is turned off when the signal $OFG_1$ is in the low state. A signal $OFG_2$ is supplied to a gate of the transistor 400b. The transistor 400b is turned on when the signal $OFG_2$ is in the high state, and is turned off when the signal $OFG_2$ is in the low state. When the transistor 400a is in an ON state, a photocurrent $Iph_1$ output from the light receiving element 401a is supplied to the address event detection unit 30. Similarly, when the transistor 400b is in the ON state, a photocurrent $Iph_2$ output from the light receiving element 401b is supplied to the address event detection unit 30.

A signal $TRG_1$ is supplied to a gate of the transistor 402a. The transistor 402a is turned on when the signal $TRG_1$ is in the high state, and is turned off when the signal $OFG_1$ is in the low state. A signal $TRG_2$ is supplied to a gate of the transistor 402b. The transistor 402b is turned on when the signal $TRG_2$ is in the high state, and is turned off when the signal $TRG_2$ is in the low state. When the transistor 402a is in the ON state, the photocurrent $Iph_1$ output from the light receiving element 401a is supplied to the pixel signal generation unit 41. Similarly, when the transistor 402b is in the ON state, the photocurrent $Iph_2$ output from the light receiving element 401b is supplied to the pixel signal generation unit 41.

In the pixel signal generation unit 41, the floating diffusion layer 413 accumulates charges, and generates a voltage according to the amount of accumulated charges. The reset transistor 410 initializes the amount of charges of the floating diffusion layer 413 according to a reset signal RST supplied from the row drive circuit 113c. The amplification transistor 411 amplifies the voltage of the floating diffusion layer 413. The selection transistor 412 outputs, as a pixel signal SIG, a signal of a voltage amplified by the amplification transistor 411 to the column drive circuit 116 via a vertical signal line VSL according to a selection signal SEL from the row drive circuit 113c.

The light receiving element 401a has a sensitivity lower than the light receiving element 401b. Hereinafter, the light receiving element 401a is appropriately referred to as a low-sensitivity PD, and the light receiving element 401b is referred to as a normal-sensitivity PD.

Figure 27:
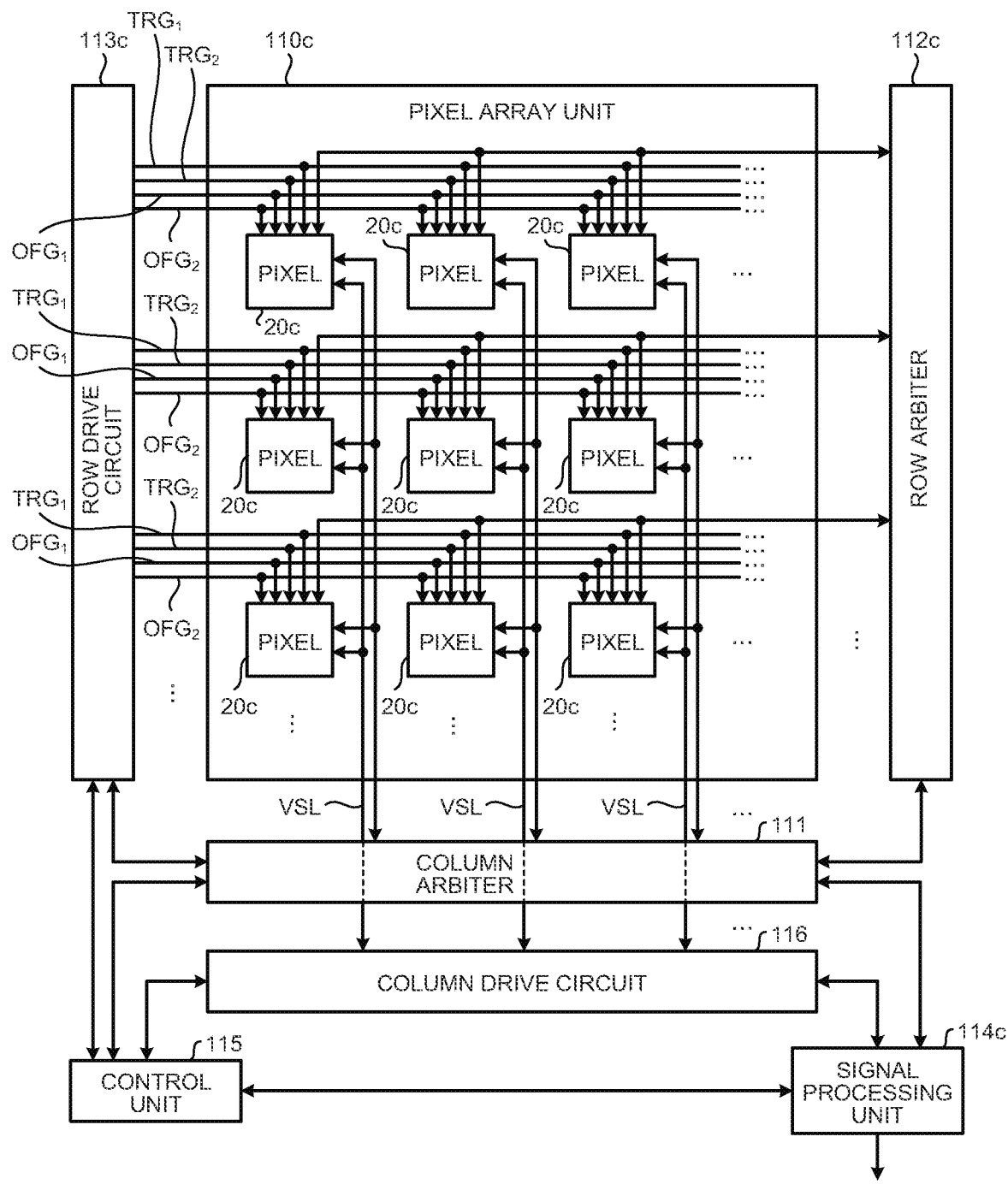
FIG. 27 is a schematic diagram illustrating an example of wirings in the pixel array unit according to the third embodiment.

FIG. 27 is a schematic diagram illustrating an example of wirings in the pixel array unit 110c according to the third embodiment. Similar to the drive circuit 113a of the pixel array unit 110a according to the first embodiment described with reference to FIG. 7, the row drive circuit 113c generates the signals $OFG_1$ and $OFG_2$ under the control of the control unit 115, and the generated signals $OFG_1$ and $OFG_2$ are supplied to each pixel 20c. In the example of FIG. 27, the row drive circuit 113c generates the signals $OFG_1$ and $OFG_2$ for each row for each pixel 20c arrayed in a two-dimensional lattice in the pixel array unit 110c.

The row drive circuit 113c further generates the signals $TRG_1$ and $TRG_2$ under the control of the control unit 115, and supplies the generated signals $TRG_1$ and $TRG_2$ to each pixel 20c. In the example of FIG. 27, the row drive circuit 113c generates the signals $TRG_1$ and $TRG_2$ for each row for each pixel 20c arrayed in a two-dimensional lattice in the pixel array unit 110c.

The vertical signal line VSL of each pixel 20c is connected to the column drive circuit 116 for each column of each pixel 20c arrayed in the pixel array unit 110c.

Although omitted in FIG. 27, the row drive circuit 113c further generates the reset signal RST and the selection signal SEL for each of the pixels 20c arrayed in the two-dimensional lattice in the pixel array unit 110c under the control of the control unit 115 for each row. The row drive circuit 113c supplies the generated reset signal RST and selection signal SEL to each pixel 20c.

Figure 28A:
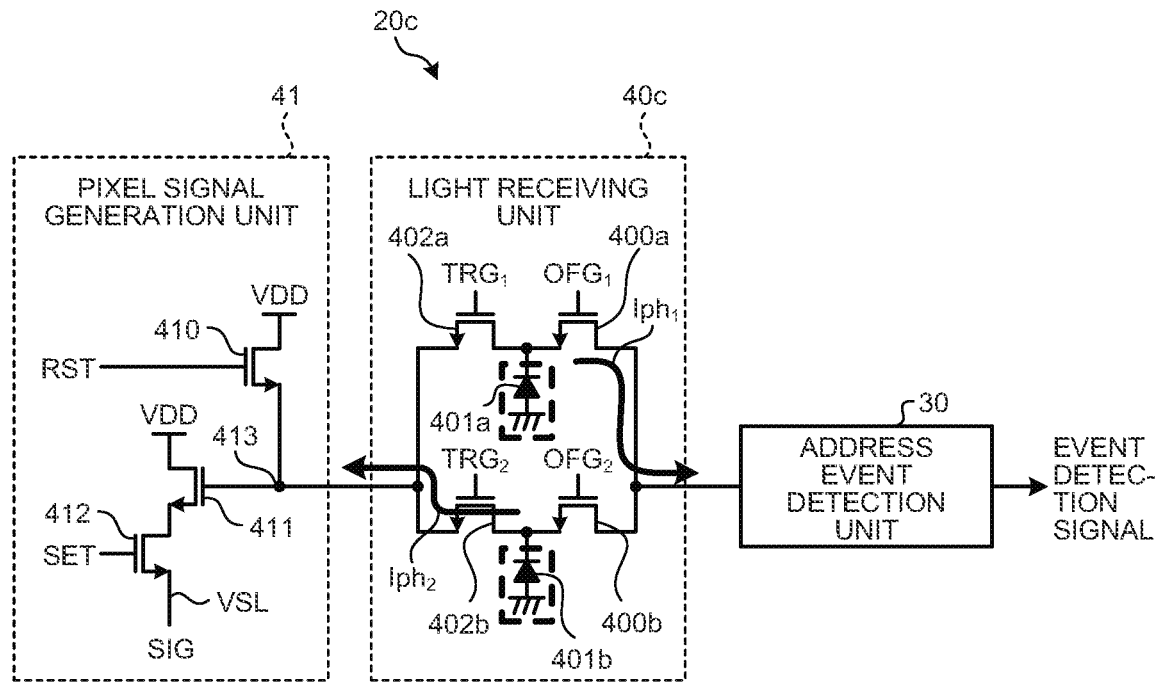
FIG. 28A is a diagram for describing control of the light receiving unit according to the third embodiment.
Figure 28B:
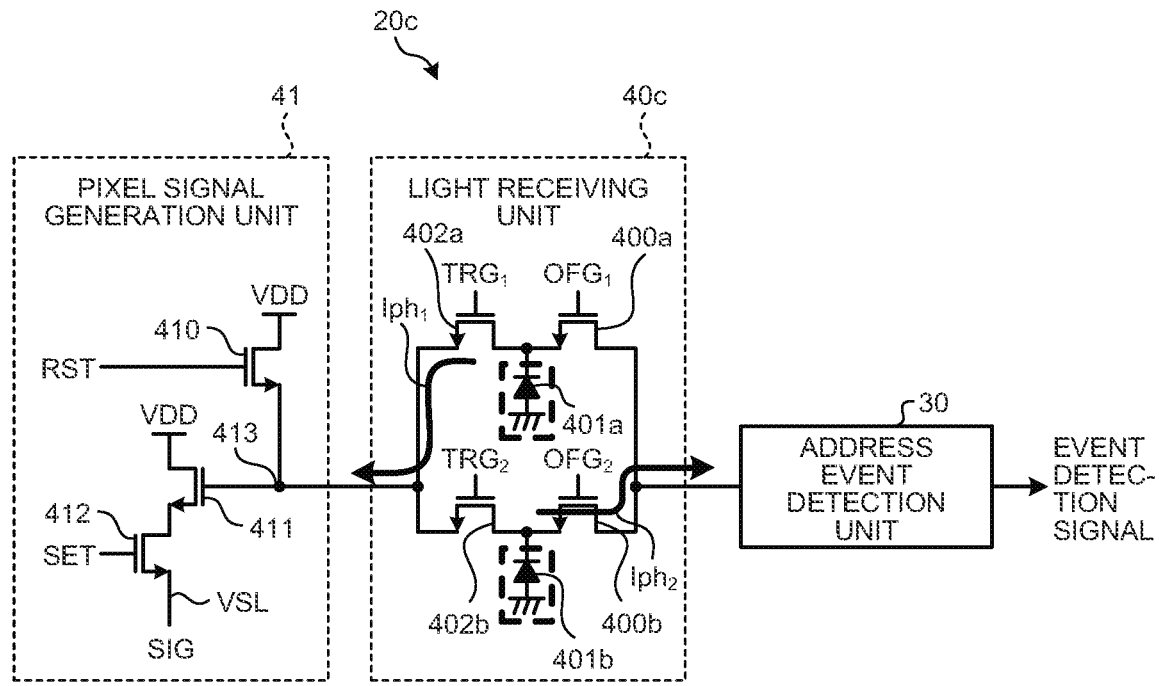
FIG. 28B is a diagram for describing the control of the light receiving unit according to the third embodiment.

FIGS. 28A and 28B are diagrams for describing the control of the light receiving unit 40c according to the third embodiment. FIG. 28A illustrates an example in which the address event is detected by the address event detection unit 30 based on the photocurrent $Iph_1$ output from the light receiving element 401a which is the low-sensitivity PD. As illustrated in FIG. 28A, the signal $OFG_1$ supplied to the gate of the transistor 400a is set to the high state, and the signal $OFG_2$ supplied to the gate of the transistor 400b is set to the low state. The signal $TRG_1$ supplied to the gate of the transistor 402a is set to the low state, and the signal $TRG_2$ supplied to the gate of the transistor 402b is set to the high state.

Accordingly, the transistor 400a is turned on, the transistor 400b is turned off, the transistor 402a is turned off, and the transistor 402b is turned on. The photocurrent $Iph_1$ of the photocurrent $Iph_1$ output from the light receiving element 401a which is the low-sensitivity PD and the photocurrent $Iph_2$ output from the light receiving element 401b which is the normal-sensitivity PD is supplied to the address event detection unit 30 via the transistor 400a, and the photocurrent $Iph_2$ is supplied to the pixel signal generation unit 41 via the transistor 402b.

FIG. 28B illustrates an example in which the address event detection unit 30 detects the address event based on the photocurrent $Iph_2$ output from the light receiving element 401b which is the normal-sensitivity PD. As illustrated in FIG. 28B, the signal $OFG_1$ supplied to the gate of the transistor 400a is set to the low state, and the signal $OFG_2$ supplied to the gate of the transistor 400b is set to the high state. The signal $TRG_1$ supplied to the gate of the transistor 402a is set to the high state, and the signal $TRG_2$ supplied to the gate of the transistor 402b is set to the low state.

Accordingly, the transistor 400a is turned off, the transistor 400b is turned on, the transistor 402a is turned on, and the transistor 402b is turned off. The photocurrent $Iph_1$ of the photocurrent $Iph_1$ output from the light receiving element 401a which is the low-sensitivity PD and the photocurrent $Iph_2$ output from the light receiving element 401b which is the normal-sensitivity PD is supplied to the address event detection unit 30 via the transistor 400b, and the photocurrent $Iph_2$ is supplied to the pixel signal generation unit 41 via the transistor 402a.

Figure 29:
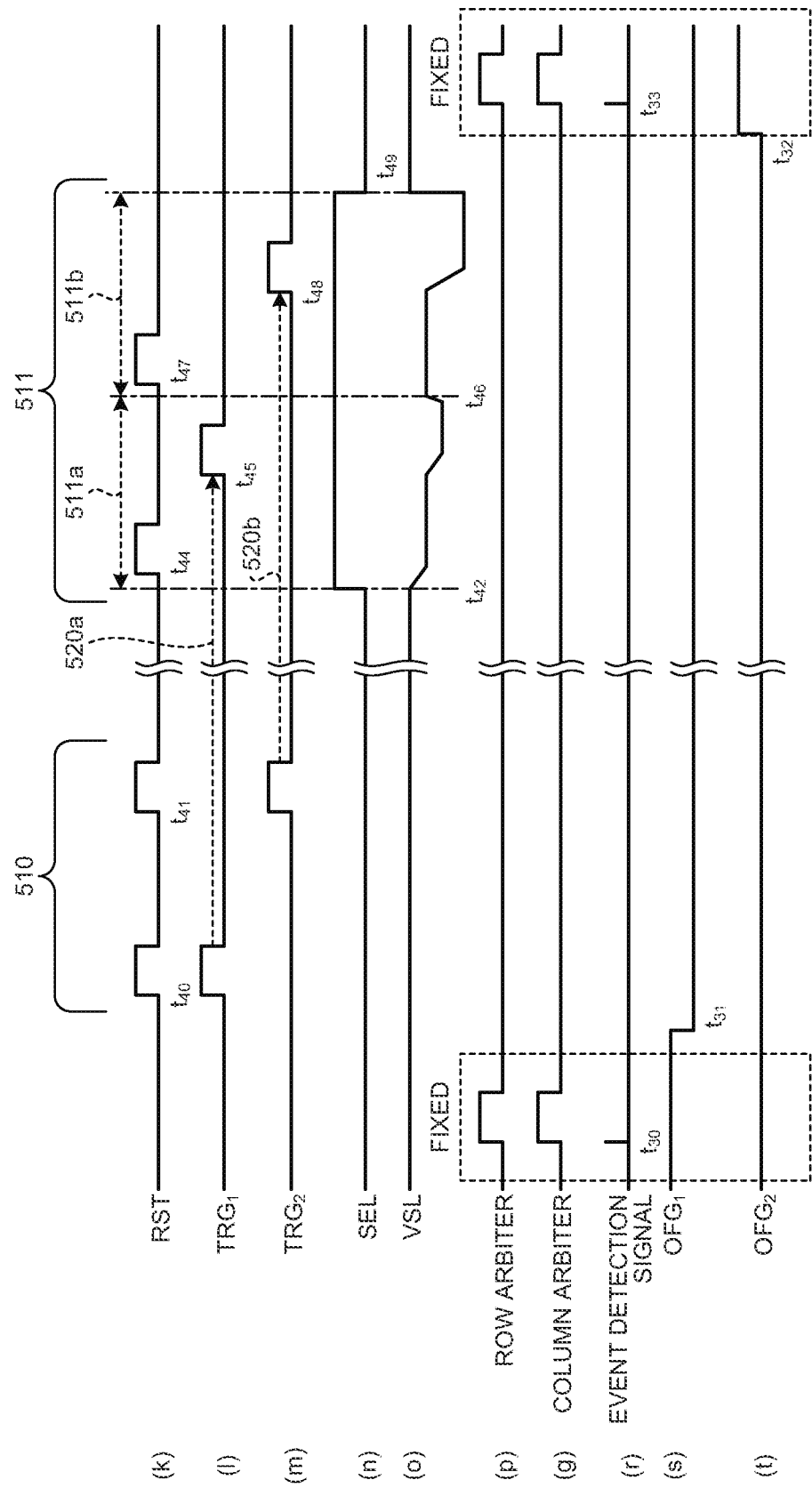
FIG. 29 is a timing chart illustrating an example of processing in the solid-state imaging device according to the third embodiment.

FIG. 29 is a timing chart illustrating an example of processing in the solid-state imaging device 11c according to the third embodiment. In FIG. 29, charts (k) and (n) illustrate examples of the reset signal RST and the selection signal SEL generated in the row drive circuit 113c. A chart (o) illustrates an example of the voltage of the pixel signal in the vertical signal line VSL.

In FIG. 29, charts (l) and (m) illustrate examples of the signals $TRG_1$ and $TRG_2$ generated in the row drive circuit 113c, and charts (s) and (t) illustrate examples of the signals $OFG_1$ and $OFG_2$ generated in the row drive circuit 113c.

In FIG. 29, a chart (r) illustrates an example of the event detection signal output from the address event detection unit 30. Charts (p) and (q) illustrate examples of arbitration for the event detection signal illustrated in the chart (r) in the row arbiter 112 and the column arbiter 111, respectively. The event detection signal illustrated in the chart (r) is selected in the high state.

In FIG. 29, the signal $OFG_1$ is in the high state and the signal $OFG_2$ is in the low state as an initial state, and the photocurrent $Iph_1$ output from the low-sensitivity PD is supplied to the address event detection unit 30. In the example of FIG. 29, the amount of change in the photocurrent $Iph_1$ in the low-sensitivity PD exceeds a predetermined amount, and the event detection signal is output from the address event detection unit 30 at a point in time $t_{30}$. The control unit 115 acquires this event detection signal from the column arbiter 111, and instructs the row drive circuit 113c to set the signal $OFG_1$ to the low state according to the acquired event detection signal. The row drive circuit 113c sets the signal $OFG_1$ to the low state according to this instruction (point in time $t_{31}$).

According to the instruction from the control unit 115, at a point in time $t_{40}$, the row drive circuit 113c sets the reset signal RST and the signal $TRG_1$ to the high state, and resets the low-sensitivity PD (light receiving element 401a) and the floating diffusion layer 413. According to the instruction from the control unit 115, at a point in time $t_{41}$, the row drive circuit 113c sets the reset signal RST and the signal $TRG_2$ to the high state, and resets the normal-sensitivity PD (light receiving element 401b) and the floating diffusion layer 413.

As described above, a period 510 including the points in point in time $t_{40}$ and $t_{41}$ is an exposure start sequence in a voltage read operation of the pixel signal SIG. During the period 510, since the selection signal SEL is maintained in the low state, the pixel signal SIG is not output to the vertical signal line VSL.

According to the instruction from the control unit 115, at a point in time $t_{42}$ after a predetermined time elapses from the point in time $t_{41}$, the row drive circuit 113c sets the selection signal SEL to the high state, and starts outputting the pixel signal SIG to the vertical signal line VSL. The row drive circuit 113c maintains the high state of the selection signal SEL until a point in time $t_{49}$ at which CDS reading using the normal-sensitivity PD (light receiving element 401b) is ended.

The row drive circuit 113c sets the reset signal RST to the high state at a point in time $t_{44}$ immediately after the point in time $t_{42}$, and sets the signal $TRG_1$ to the high state at a point in time $t_{45}$. A pixel signal $SIG_1$ based on the photocurrent $Iph_1$ output from the low-sensitivity PD (light receiving element 401a) is supplied to the column drive circuit 116 via the vertical signal line VSL, and the CDS reading of the low-sensitivity PD is performed (period 511a).

Subsequently, the row drive circuit 113c sets the reset signal RST to the high state at a point in time $t_{47}$ immediately after a point in time $t_{46}$ at which the CDS reading of the low-sensitivity PD is ended, and sets the signal $TRG_2$ to the high state at a point in time $t_{48}$. Ae pixel signal $SIG_2$ based on the photocurrent $Iph_2$ output from the normal-sensitivity PD (light receiving element 401b) is supplied to the column drive circuit 116 via the vertical signal line VSL, and the CDS reading of the normal-sensitivity PD is performed (period 511b).

As described above, a period 511 including the periods 511a and 511b is a reading sequence in the voltage read operation of the pixel signal SIG.

Here, in the row drive circuit 113c, a time 520a from the point in time $t_{40}$ at which the signal $TRG_1$ is in the high state in the period 510 to the point in time $t_{44}$ at which the signal $TRG_1$ is in the high state in the period 511 and a time 520b from the point in time $t_{41}$ at which the signal $TRG_2$ is in the high state in the period 510 to the point in time $t_{48}$ at which the signal $TRG_2$ is in the high state in the period 511 is set to be equal, and an exposure time of the low-sensitivity PD (light receiving element 401a) and an exposure time of the normal-sensitivity PD (light receiving element 401b) are aligned.

When the CDS reading of the normal-sensitivity PD is ended, the row drive circuit 113c sets the selection signal SEL to the low state, and stops outputting the pixel signal SIG from the pixel signal generation unit 41.

The control unit 115 acquires the pixel signal $SIG_1$ read in the period 511a and the pixel signal $SIG_2$ read in the period 511b from the column drive circuit 116. The control unit 115 selects the photocurrent $Iph_{det}$ used for the address event detection in the address event detection unit 30 of the photocurrent $Iph_1$ of the low-sensitivity PD (light receiving element 401a) and the photocurrent $Iph_2$ of the normal-sensitivity PD (light receiving element 401b) based on the acquired pixel signals $SIG_1$ and $SIG_2$.

Here, it is assumed that the control unit 115 selects, as the photocurrent $Iph_{det}$ used for the address event detection in the address event detection unit 30, the photocurrent $Iph_2$ of the normal-sensitivity PD. According to the instruction from the control unit 115 corresponding to this selection, at a point in time $t_{32}$, the row drive circuit 113c sets the signal $OFG_1$ to the low state and the signal $OFG_2$ to the high state, and supplies the photocurrent $Iph_2$ output from the normal-sensitivity PD (light receiving element 401b) to the address event detection unit 30.

In the example of FIG. 29, it is assumed that the amount of change in the photocurrent $Iph_2$ in the normal-sensitivity PD exceeds the predetermined amount, and the event detection signal is output from the address event detection unit 30 at a point in time $t_{33}$.

In the third embodiment, the control unit 115 sets a timing at which the address event detection unit 30 executes the address event detection (indicated by a dotted frame in FIG. 29) to be fixed, and performs control such that the address event detection using the address event detection unit 30 is executed at constant cycles. That is, one cycle of the execution of the address event detection includes a pixel signal read operation in the periods 510 and 511, and an address event detection based on the read operation.

Figure 30:
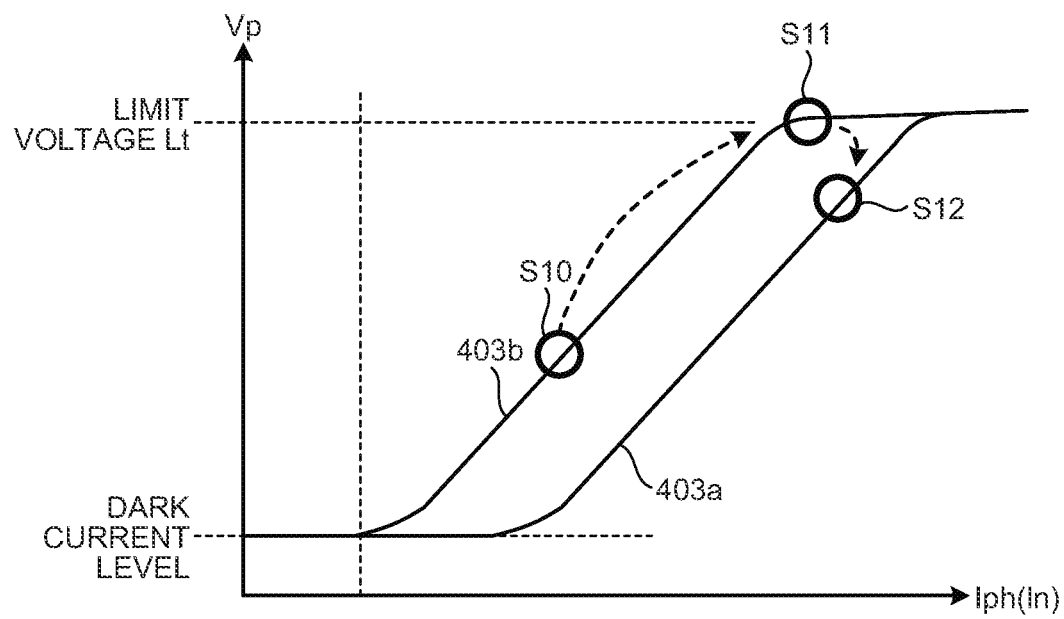
FIG. 30 is a diagram for describing a method of switching between a low-sensitivity PD and a normal-sensitivity PD based on a voltage difference according to the third embodiment.
Figure 31:
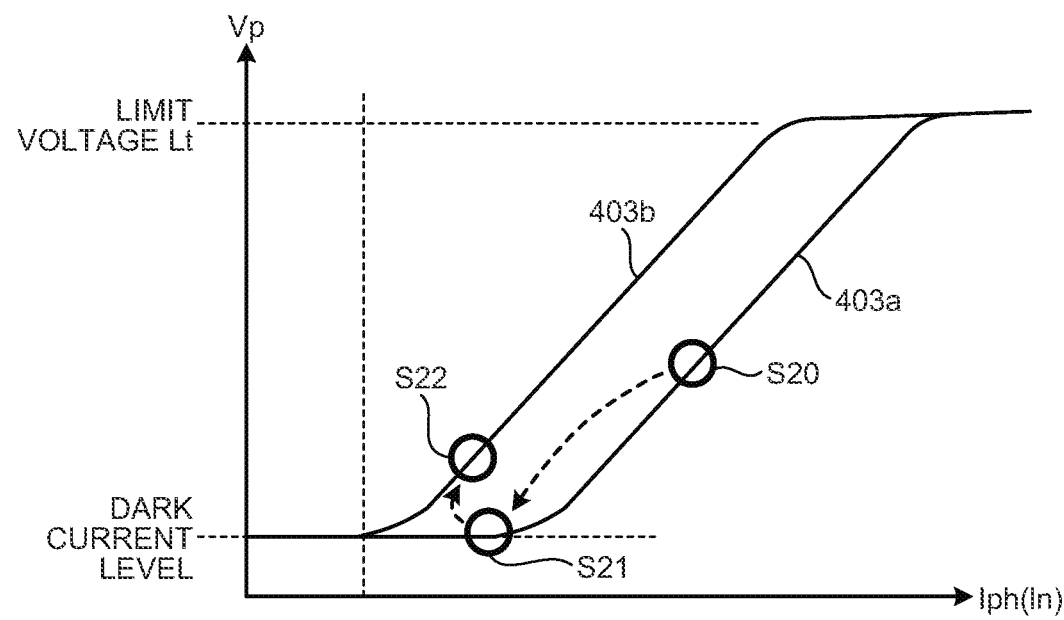
FIG. 31 is a diagram for describing a method of switching between the low-sensitivity PD and the normal-sensitivity PD based on the voltage difference according to the third embodiment.

FIGS. 30 and 31 are diagrams for describing a method of switching between the low-sensitivity PD and the normal-sensitivity PD based on a voltage difference according to the third embodiment. FIGS. 30 and 31 are diagrams corresponding to FIG. 14. The meanings of the horizontal axis and the vertical axis and the characteristic lines 403a and 403b are common to FIG. 14, and thus, the description thereof is omitted here.

FIG. 30 illustrates an example of an operation of switching the photocurrent $Iph_{det}$ used by the address event detection unit 30 to the photocurrent $Iph_1$ output from the low-sensitivity PD (light receiving element 401a) from the photocurrent $Iph_2$ output from the normal-sensitivity PD (light receiving element 401b) when the amount of light is increased.

In FIG. 30, it is assumed that the signal $OFG_1$ is initially in the low state, the signal $OFG_2$ is in the high state, and the photocurrent $Iph_2$ of the normal-sensitivity PD is selected as the photocurrent $Iph_{det}$ used by the address event detection unit 30. In step S10, an increase in the amount of light received by the pixel 20c is detected. In the third embodiment, for example, the control unit 115 determines whether or not the amount of light is increased based on the pixel signal SIG read in the period 511 of FIG. 29. The present invention is not limited thereto, and the control unit 115 may determine an increase in the amount of light based on the output voltage Vp of the current-to-voltage conversion unit 300a included in the address event detection unit 30.

When it is determined that the amount of light is increased, the control unit 115 determines whether or not the output voltage Vp of the current-to-voltage conversion unit 300a included in the address event detection unit 30 falls in a limit region of the limit voltage Lt. For example, when it is determined that the output voltage Vp falls in the limit region in step S11, the control unit 115 switches the photocurrent $Iph_{det}$ used for address event detection by the address event detection unit 30 to the photocurrent $Iph_1$ of the low-sensitivity PD in synchronization with the detection of the up event using the address event detection unit 30, and acquires the output voltage Vp.

The control unit 115 compares the acquired output voltage Vp (referred to as a voltage $Vp_{low}$) of the photocurrent $Iph_1$ of the low-sensitivity PD with the output voltage Vp (referred to as a voltage $Vp_{nml}$) used for the determination in step S11. As the comparison result, when a difference between the voltage $Vp_{low}$ and the voltage $Vp_{nml}$ is equal to or less than a predetermined value, the control unit 115 sets the signal $OFG_1$ to the high state and the signal $OFG_2$ to the low state, and switches the photocurrent $Iph_{det}$ used for the address event detection by the address event detection unit 30 from the photocurrent $Iph_2$ to the photocurrent $Iph_1$ (step S12).

FIG. 31 illustrates an example of an operation of switching the photocurrent $Iph_{det}$ used by the address event detection unit 30 from the photocurrent $Iph_1$ output by the low-sensitivity PD (light receiving element 401a) to the photocurrent $Iph_2$ output by the normal-sensitivity PD (light receiving element 401b) when the amount of light is decreased.

In FIG. 31, it is assumed that the signal $OFG_1$ is initially in the high state, the signal $OFG_2$ is in the low state, and the photocurrent $Iph_1$ of the low-sensitivity PD is selected as the photocurrent Iph$_{det}$ used by the address event detection unit 30. In step S20, a decrease in the amount of light received by the pixel 20c is detected based on, for example, the pixel signal SIG read in the period 511 in FIG. 29.

When it is determined that the amount of light is decreased, the control unit 115 determines whether or not the output voltage Vp of the current-to-voltage conversion unit 300a included in the address event detection unit 30 falls in a dark current region of the dark current level. For example, when it is determined that the output voltage Vp falls in the dark current region in step S21, the control unit 115 switches the photocurrent Iph$_{det}$ used for the address event detection by the address event detection unit 30 in synchronization with the detection of the down event using the address event detection unit 30 to the photocurrent Iph$_2$ of the normal-sensitivity PD, and acquires the output voltage Vp.

The control unit 115 compares the acquired output voltage Vp (voltage Vp$_{nml}$) of the photocurrent Iph$_2$ of the normal-sensitivity PD with the output voltage Vp (voltage Vp$_{low}$) used for the determination in step S21. As the comparison result, when a difference between the voltage Vp$_{nml}$ and the voltage Vp$_{low}$ is equal to or less than a predetermined value, the control unit 115 sets the signal OFG$_1$ to the low state and the signal OFG$_2$ to the high state, and switches the photocurrent Iph$_{det}$ used for the address event detection by the address event detection unit 30 from the photocurrent Iph$_1$ to the photocurrent Iph$_2$ (step S22).

Figure 32:
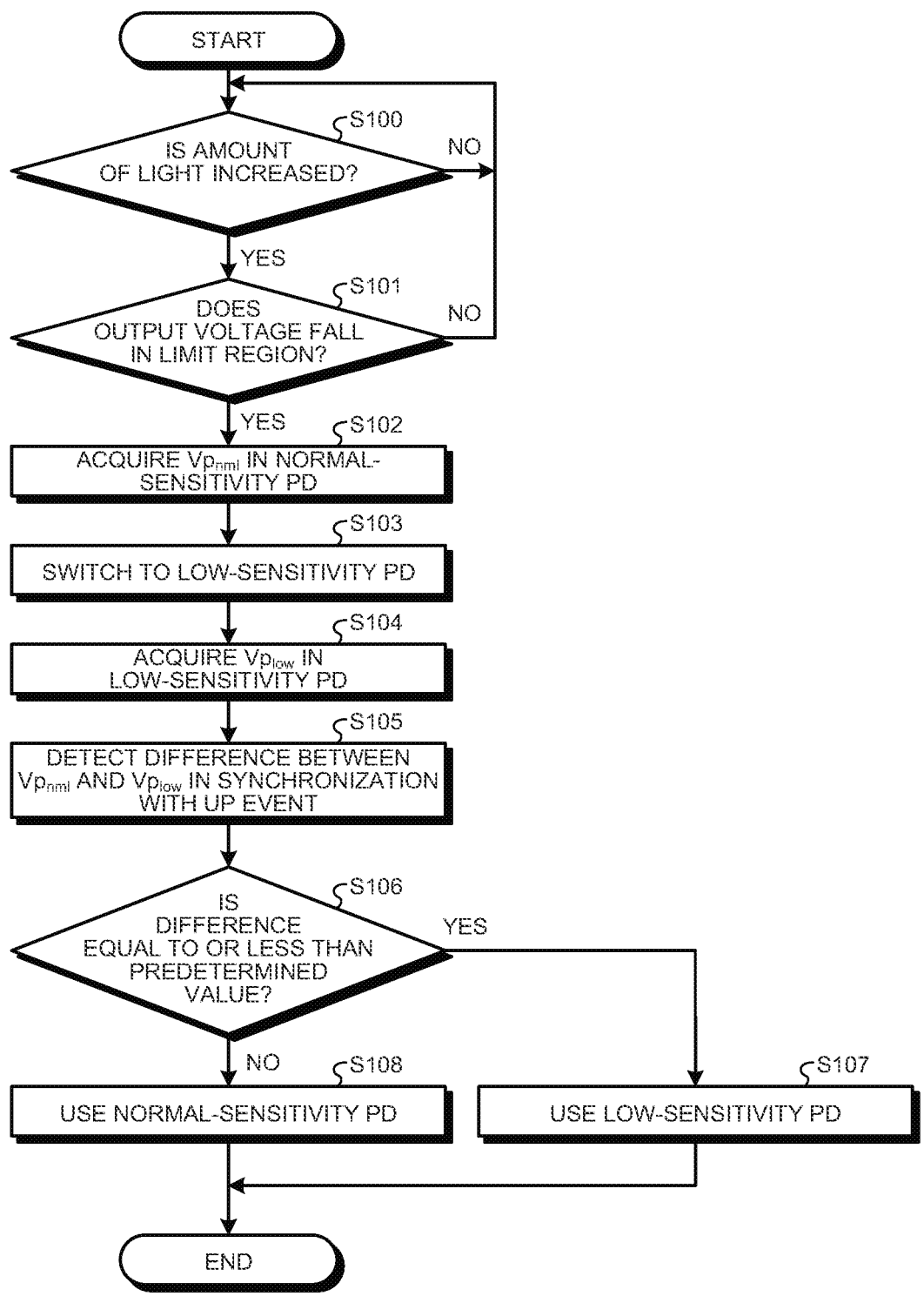
FIG. 32 is a flowchart of an example illustrating an operation of switching between photocurrents Iph when the amount of light received by the pixel is increased according to the third embodiment.

FIG. 32 is a flowchart of an example of an operation of switching the photocurrent Iph when the amount of light received by the pixel 20c is increased according to the third embodiment described with reference to FIG. 30. Prior to the processing according to the flowchart of FIG. 32, it is assumed that the signal OFG$_1$ is in the low state, the signal OFG$_2$ is in the high state, and the photocurrent Iph$_2$ of the normal-sensitivity PD is selected as the photocurrent Iph$_{det}$ used for the address event detection by the address event detection unit 30.

In step S100, for example, the control unit 115 determines whether or not the amount of light received by the pixel 20c is increased based on the pixel signal SIG. When the control unit 115 determines that the amount of light is not increased (step S100, "No"), the processing returns to step S100. Meanwhile, when the control unit 115 determines that the amount of light received by the pixel 20c is increased (step S100, "Yes"), the processing proceeds to step S101.

In step S101, the control unit 115 determines whether or not the output voltage Vp (voltage Vp$_{nml}$) of the current-to-voltage conversion unit 300a falls in the limit region. When the control unit 115 determines that the voltage Vp$_{nml}$ does not fall in the limit region (step S101, "No"), the processing returns to step S100, for example. Meanwhile, when the control unit 115 determines that the voltage Vp$_{nml}$ falls in the limit region (step S101, "Yes"), the processing proceeds to step S102.

In step S102, the control unit 115 acquires the voltage Vp$_{nml}$ based on the photocurrent Iph$_2$ of the normal-sensitivity PD. In the next step S103, the control unit 115 sets the signal OFG$_1$ to the high state and the signal OFG$_2$ to the low state, and switches the photocurrent Iph supplied to the address event detection unit 30 to the photocurrent Iph$_1$ of the low-sensitivity PD. In the next step S104, the control unit 115 acquires the voltage Vp$_{low}$ based on the photocurrent Iph$_1$ of the low-sensitivity PD.

In the next step S105, for example, the control unit 115 detects the difference between the voltage Vp$_{nml}$ obtained in step S102 and the voltage Vp$_{low}$ acquired in step S104 in synchronization with the up event detected based on the photocurrent Iph$_2$ of the normal-sensitivity PD during the period of step S100 and step S101.

In the next step S106, control unit 115 determines whether or not the difference detected in step S105 is equal to or less than a predetermined value. When the control unit 115 determines that the difference is equal to or less than the predetermined value (step S106, "Yes"), the processing proceeds to step S107. In step S107, the control unit 115 sets the signal OFG$_1$ to the high state and the signal OFG$_2$ to the low state, and selects, as the photocurrent Iph$_{det}$ used for the address event detection by the address event detection unit 30, the photocurrent Iph$_1$ of the low-sensitivity PD.

Meanwhile, when the control unit 115 determines in step S106 that the difference exceeds the predetermined value (step S106, "No"), the processing proceeds to step S108. In step S108, the control unit 115 maintains the states of the signals OFG$_1$ and OFG$_2$, and selects, as the photocurrent Iph$_{det}$ used for the address event detection by the address event detection unit 30, the photocurrent Iph$_2$ of the normal-sensitivity PD.

When the processing of step S107 or step S108 is ended, the series of processing according to the flowchart of FIG. 32 is ended.

Figure 33:
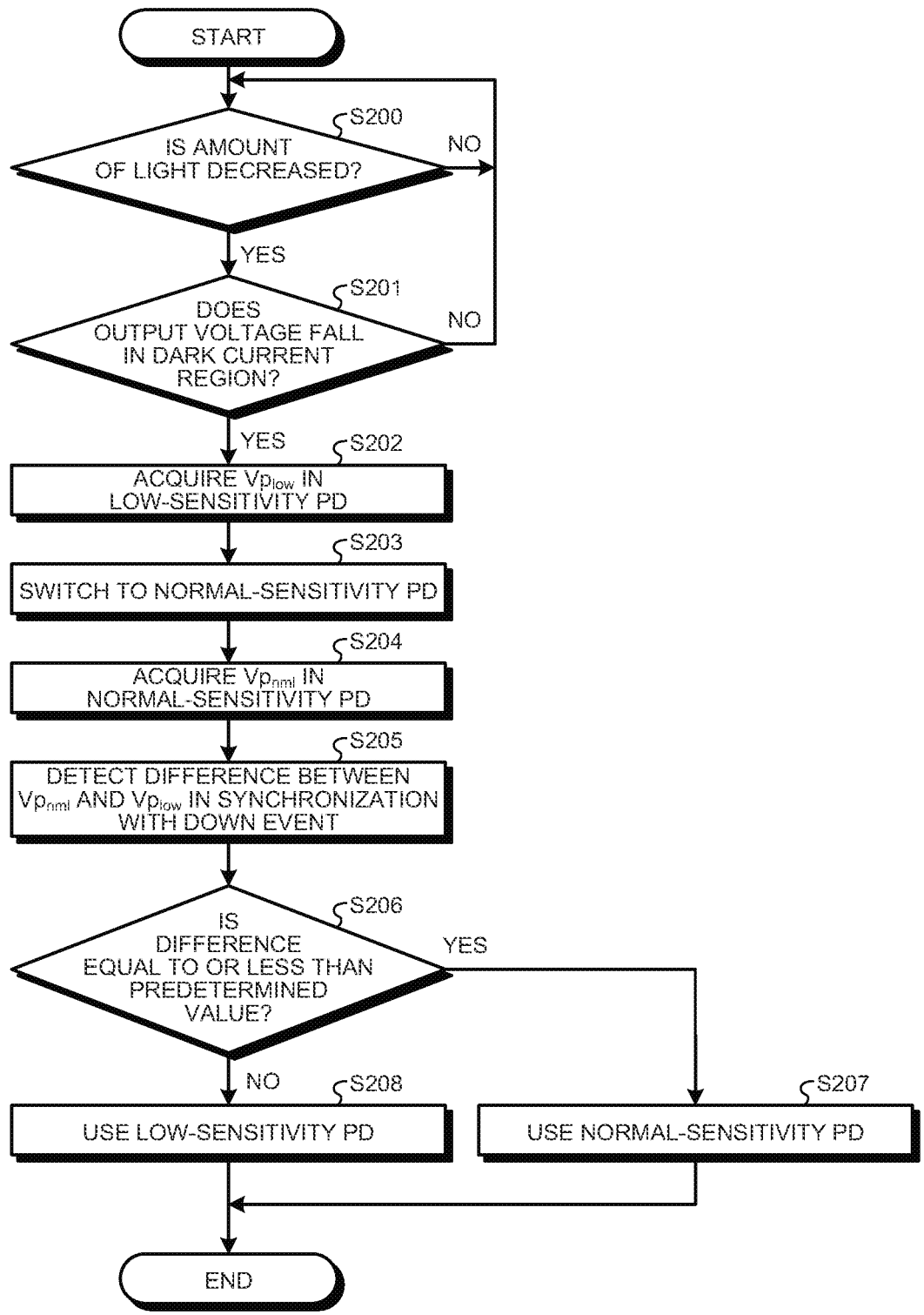
FIG. 33 is a flowchart of an example illustrating an operation of switching the photocurrents Iph when the amount of light received by the pixel is decreased according to the third embodiment.

FIG. 33 is a flowchart of an example of an operation of switching the photocurrent Iph when the amount of light received by the pixel 20c is decreased according to the third embodiment described with reference to FIG. 31. Prior to the processing according to the flowchart of FIG. 33, it is assumed that the signal OFG$_1$ is in the high state, the signal OFG$_2$ is in the low state, and the photocurrent Iph$_1$ of the low-sensitivity PD is selected as the photocurrent Iph$_{det}$ used for the address event detection by the address event detection unit 30.

In step S200, for example, the control unit 115 determines whether or not the amount of light received by the pixel 20c is decreased based on the pixel signal SIG. When the control unit 115 determines that the amount of light is not decreased (step S200, "No"), the processing returns to step S200. Meanwhile, when the control unit 115 determines that the amount of light received by the pixel 20c is decreased (step S200, "Yes"), the processing proceeds to step S201.

In step S201, the control unit 115 determines whether or not the output voltage Vp (voltage Vp$_{low}$) of the current-to-voltage conversion unit 300a falls in the dark current region. When the control unit 115 determines that the voltage Vp$_{low}$ does not fall in the dark current region (step S201, "No"), the processing returns to step S200, for example. Meanwhile, when the control unit 115 determines that the voltage Vp$_{low}$ falls in the dark current region (step S201, "Yes"), the processing proceeds to step S202.

In step S202, the control unit 115 acquires the voltage Vp$_{lows}$ based on the photocurrent Iph$_1$ of the low-sensitivity PD. In the next step S203, the control unit 115 sets the signal OFG$_1$ to the low state and the signal OFG$_2$ to the high state, and switches the photocurrent Iph supplied to the address event detection unit 30 to the photocurrent Iph$_2$ of the normal-sensitivity PD. In the next step S204, the control unit 115 acquires the voltage Vp$_{nml}$ based on the photocurrent Iph$_2$ of the normal-sensitivity PD.

In the next step S205, for example, the control unit 115 detects the difference between the voltage Vp$_{low}$ acquired in step S202 and the voltage Vp$_{nml}$ acquired in step S204 in synchronization with the down event detected based on the photocurrent Iph$_1$ of the low-sensitivity PD during the period of step S200 and step S201.

In the next step S206, the control unit 115 determines whether or not the difference detected in step S205 is equal to or less than a predetermined value. When the control unit 115 determines that the difference is equal to or less than the predetermined value (step S206, "Yes"), the processing proceeds to step S207. In step S207, the control unit 115 sets the signal $OFG_1$ to the low state and the signal $OFG_2$ to the high state, and selects, as the photocurrent $Iph_{det}$ used for the address event detection by the address event detection unit 30, the photocurrent $Iph_2$ of the normal-sensitivity PD.

Meanwhile, when the control unit 115 determines in step S206 that the difference exceeds the predetermined value (step S206, "No"), the processing proceeds to step S208. In step S208, the control unit 115 maintains the states of the signals $OFG_1$ and $OFG_2$, and selects, as the photocurrent $Iph_{det}$ used for the address event detection by the address event detection unit 30, the photocurrent $Iph_1$ of the low-sensitivity PD.

When the processing of step S207 or step S208 is ended, the series of processing according to the flowchart of FIG. 33 is ended.

As stated above, in the third embodiment, the amount of light received by the pixel 20c is determined based on the pixel signal SIG, and the photocurrent $Iph_{det}$ used for the address event detection by the address event detection unit 30 is selected from the photocurrents $Iph_1$ and $Iph_2$ based on the determination result. Thus, the processing of selecting the photocurrent $Iph_{det}$ from the photocurrents $Iph_1$ and $Iph_2$ can be executed with higher accuracy.

The effects described in the present specification are merely examples, and are not limited. There may be other effects.

Note that the present technology can also have the following configurations.

(1) A solid-state imaging device comprising:
a plurality of pixels arrayed in a two-dimensional lattice; and
a control unit, wherein
the pixel includes
a first light receiving element that outputs a first photocurrent corresponding to received light,
a second light receiving element that outputs a second photocurrent corresponding to received light,
a conversion unit that converts a current into a voltage,
an output unit that detects an event based on a change in the voltage converted by the conversion unit, and outputs a detection signal indicating a detection result of the detection, and
a switch unit that performs switching of switching the current to be converted into the voltage by the conversion unit between the first photocurrent and the second photocurrent, and
the control unit controls the switching performed by the switch unit.

(2) The solid-state imaging device according to (1), wherein
the first light receiving element has sensitivity lower than the second light receiving element, and
the control unit controls the switching based on the amount of change in the amount of light applied to the pixel.

(3) The solid-state imaging device according to (1) or (2), wherein
the pixel further includes a generation unit that generates a pixel signal based on an absolute value of the first photocurrent or the second photocurrent, and
the control unit controls the switching based on the pixel signal.

(4) The solid-state imaging device according to (3), wherein
the control unit
further controls the switching based on the amount of change in the amount of light applied to the pixel, and
repeatedly executes the control of the switching based on the pixel signal and the control of the switching based on the amount of change in the amount of light at constant cycles.

(5) The solid-state imaging device according to any one of (1) to (4), wherein
the conversion unit includes a limiter that sets an upper limit value of the converted voltage, and
the switch unit controls the switching based on the voltage converted by the conversion unit and a voltage range defined based on the upper limit value.

(6) The solid-state imaging device according to any one of (1) to (5), wherein
the control unit controls the switching such that the current to be converted into the voltage by the conversion unit is switched from the first photocurrent to the second photocurrent when the first photocurrent is equal to or less than a predetermined value.

(7) The solid-state imaging device according to (1), wherein
the first light receiving element and the second light receiving element have the same sensitivity, and
the control unit controls the switching in a time division manner.

(8) The solid-state imaging device according to (7), wherein
the output unit detects the event based on a difference between the first photocurrent and the second photocurrent.

(9) The solid-state imaging device according to (7) or (8), wherein
a light receiving state of the first light receiving element and a light receiving state of the second light receiving element are different.

(10) The solid-state imaging device according to (9), wherein
a light shielding pattern in which the first light receiving element and the second light receiving element are different is provided.

(11) The solid-state imaging device according to any one of (1) to (10), wherein
the switch unit maintains a state in which the switching is controlled for each pixel.

(12) A method of controlling a solid-state imaging device, the method comprising:
a first output step of outputting a first photocurrent corresponding to light received by a first light receiving element included in a pixel;
a second output step of outputting a second photocurrent corresponding to light received by a second light receiving element included in the pixel;
a conversion step of, by a conversion unit included in the pixel, converting a current into a voltage;
a detection step of, by a detection unit included in the pixel, detecting an event based on a change in the voltage converted in the conversion step, and outputting a detection signal indicating a detection result of the detection;
a switch step of switching, by a switch unit included in the pixel, the current to be converted into the voltage in the conversion step between the first photocurrent and the second photocurrent; and
a control step of controlling the switch step.

(13) An electronic device comprising:
a solid-state imaging device that includes
a plurality of pixels arrayed in a two-dimensional lattice, and
a control unit,
the pixel including a first light receiving element that outputs a first photocurrent corresponding to received light, a second light receiving element that outputs a second photocurrent corresponding to received light, a conversion unit that converts a current into a voltage, an output unit that detects an event based on a change in the voltage converted by the conversion unit, and outputs a detection signal indicating a detection result of the detection, and a switch unit that performs switching of switching the current to be converted into the voltage by the conversion unit between the first photocurrent and the second photocurrent, and the control unit controlling the switching performed by the switch unit; and a storage unit that stores a signal based on the voltage converted by the conversion unit.

REFERENCE SIGNS LIST

1 IMAGING APPARATUS
11, 11a, 11c SOLID-STATE IMAGING DEVICE
20a, 20b, 20b(a), 20b(b), 20b(c), 20c PIXEL
21 SWITCH
30 ADDRESS EVENT DETECTION UNIT
40a, 40b, 40c LIGHT RECEIVING UNIT
41 PIXEL SIGNAL GENERATION UNIT
110a, 110b, 110c PIXEL ARRAY UNIT
111 COLUMN ARBITER
112 ROW ARBITER
113a, 113b DRIVE CIRCUIT
113c ROW DRIVE CIRCUIT
115 CONTROL UNIT
116 COLUMN DRIVE CIRCUIT
401a, 401b, 401c, 401d LIGHT RECEIVING ELEMENT
300, 300a CURRENT-TO-VOLTAGE CONVERSION UNIT
407 LIGHT SHIELDING PATTERN
408 POLARIZATION FILTER

The invention claimed is:

1. A solid-state imaging device comprising:
a plurality of pixels arrayed in a two-dimensional lattice; and
a control unit, wherein
a pixel of the plurality of pixels includes:
a first light receiving element that outputs a first photocurrent corresponding to received light;
a second light receiving element that outputs a second photocurrent corresponding to the received light;
a conversion unit that converts a current into a voltage;
an output unit that detects an event based on a change in the voltage converted by the conversion unit, and outputs a detection signal indicating a detection result of the detection; and
a switch unit that performs switching of the current to be converted into the voltage by the conversion unit between the first photocurrent and the second photocurrent, and
the control unit controls the switching performed by the switch unit.

2. The solid-state imaging device according to claim 1, wherein
the first light receiving element has sensitivity lower than the second light receiving element, and
the control unit controls the switching based on an amount of change in an amount of light applied to the pixel.

3. The solid-state imaging device according to claim 1, wherein
the pixel further includes a generation unit that generates a pixel signal based on an absolute value of one of the first photocurrent or the second photocurrent, and
the control unit controls the switching based on the pixel signal.

4. The solid-state imaging device according to claim 3, wherein the control unit;
controls the switching based on an amount of change in an amount of light applied to the pixel, and
repeatedly executes the control of the switching based on the pixel signal and the control of the switching based on the amount of change in the amount of light at constant cycles.

5. The solid-state imaging device according to claim 1, wherein
the conversion unit includes a limiter that sets an upper limit value of the converted voltage, and
the switch unit controls the switching based on the voltage converted by the conversion unit and a voltage range defined based on the upper limit value.

6. The solid-state imaging device according to claim 1, wherein
the control unit controls the switching such that the current to be converted into the voltage by the conversion unit is switched from the first photocurrent to the second photocurrent when the first photocurrent is equal to or less than a predetermined value.

7. The solid-state imaging device according to claim 1, wherein
the first light receiving element and the second light receiving element have the same sensitivity, and
the control unit controls the switching in a time division manner.

8. The solid-state imaging device according to claim 7, wherein
the output unit detects the event based on a difference between the first photocurrent and the second photocurrent.

9. The solid-state imaging device according to claim 7, wherein
a light receiving state of the first light receiving element is different from a light receiving state of the second light receiving element.

10. The solid-state imaging device according to claim 9, further comprising a light shielding pattern that shields portions of the first light receiving element and the second light receiving element.

11. The solid-state imaging device according to claim 1, wherein
the switch unit maintains a state in which the switching is controlled for each pixel of the plurality of pixels.

12. A method of controlling a solid-state imaging device, the method comprising:
outputting a first photocurrent corresponding to light received by a first light receiving element included in a pixel;
outputting a second photocurrent corresponding to light received by a second light receiving element included in the pixel;
converting, by a conversion unit included in the pixel, a current into a voltage;
detecting, by a detection unit included in the pixel, an event based on a change in the voltage converted by the conversion unit, and outputting a detection signal indicating a detection result of the detection;

switching, by a switch unit included in the pixel, the current to be converted into the voltage by the conversion unit between the first photocurrent and the second photocurrent; and controlling the switching by the switch unit.

13. An electronic device, comprising:
a solid-state imaging device that includes:
a plurality of pixels arrayed in a two-dimensional lattice; and
a control unit, wherein
a pixel of the plurality of pixels includes:
a first light receiving element that outputs a first photocurrent corresponding to received light;
a second light receiving element that outputs a second photocurrent corresponding to the received light;
a conversion unit that converts a current into a voltage;
an output unit that detects an event based on a change in the voltage converted by the conversion unit, and outputs a detection signal indicating a detection result of the detection; and
a switch unit that performs switching of the current to be converted into the voltage by the conversion unit between the first photocurrent and the second photocurrent, and
the control unit controls the switching performed by the switch unit; and
a storage unit that stores a signal based on the voltage converted by the conversion unit.

* * * * *